United States Patent
Ocalan et al.

(10) Patent No.: US 9,595,893 B2
(45) Date of Patent: Mar. 14, 2017

(54) NON-STATIONARY MULTI-FREQUENCY VIBRATION ENERGY HARVESTING WITH TUNABLE ELECTRICAL IMPEDANCE

(71) Applicants: Murat Ocalan, Houston, TX (US);
Jahir Pabon, Newton, MA (US);
Samuel Chang, Cambridge, MA (US);
Jeffrey Lang, Sudbury, MA (US)

(72) Inventors: Murat Ocalan, Houston, TX (US);
Jahir Pabon, Newton, MA (US);
Samuel Chang, Cambridge, MA (US);
Jeffrey Lang, Sudbury, MA (US)

(73) Assignees: SCHLUMBERGER TECHNOLOGY CORPORATION, Sugar Land, TX (US); MASSACHUSETTS INSTITUTE OF TECHNOLOGY, Cambridge, MA (US)

( * ) Notice: Subject to any disclaimer, the term of this patent is extended or adjusted under 35 U.S.C. 154(b) by 834 days.

(21) Appl. No.: 13/942,397

(22) Filed: Jul. 15, 2013

(65) Prior Publication Data
US 2014/0021825 A1 Jan. 23, 2014

Related U.S. Application Data

(60) Provisional application No. 61/674,715, filed on Jul. 23, 2012.

(51) Int. Cl.
*H02N 11/00* (2006.01)
*H02N 2/18* (2006.01)
(Continued)

(52) U.S. Cl.
CPC ........... *H02N 11/002* (2013.01); *H02N 2/181* (2013.01); *H03H 11/481* (2013.01); *H03H 11/485* (2013.01); *H03H 19/006* (2013.01)

(58) Field of Classification Search
CPC .... H02N 11/002; H02N 2/181; H03H 11/485; H03H 11/481; H03H 19/006
(Continued)

(56) References Cited

U.S. PATENT DOCUMENTS

| 6,522,048 B1 * | 2/2003 | Burns | H02N 2/181 310/316.01 |
| 6,995,496 B1 | 2/2006 | Hagood, IV et al. | |

(Continued)

FOREIGN PATENT DOCUMENTS

| JP | 2012060864 | 3/2012 |
| KR | 1020110028713 | 3/2011 |
| KR | 1020120068348 | 6/2012 |

OTHER PUBLICATIONS

International Search Report and Written Opinion of PCT Application No. PCT/US2013/050618 dated Oct. 15, 2013: pp. 1-11.
(Continued)

*Primary Examiner* — Viet Nguyen
(74) *Attorney, Agent, or Firm* — Bridget M. Laffey; Jakub Michna

(57) ABSTRACT

Harvesting energy from non-stationary, multi-frequency mechanical vibrations using a tunable electrical circuit. In an embodiment, an apparatus for converting vibrational energy to electrical energy includes a vibrational energy harvester having a transducer for generating time-varying electrical signals in response to environmental vibration; at least one power storage device; a switching network operably coupled between the transducer of the vibrational energy harvester and the at least one power storage device, wherein the switching network includes a plurality of switching elements each defining a switchable current path that is controlled by a control signal supplied to the respective switching element; and electronics configured to generate the control signals for supply to the switching elements of the switching
(Continued)

network, the electronics including first circuitry, second circuitry, third circuitry, and fourth circuitry.

21 Claims, 24 Drawing Sheets

(51) Int. Cl.
*H03H 11/48* (2006.01)
*H03H 19/00* (2006.01)

(58) Field of Classification Search
USPC .......................................... 310/319; 290/1 R
See application file for complete search history.

(56) References Cited

U.S. PATENT DOCUMENTS

| | | | | |
|---|---|---|---|---|
| 7,105,982 | B1* | 9/2006 | Hagood, IV | H02N 2/181 |
| | | | | 310/319 |
| 8,378,622 | B2 | 2/2013 | Yang et al. | |
| 2008/0122408 | A1* | 5/2008 | Keiter | F02D 29/06 |
| | | | | 322/28 |
| 2008/0218132 | A1* | 9/2008 | Pelrine | H02N 11/002 |
| | | | | 322/2 A |
| 2009/0127976 | A1* | 5/2009 | Ward | F03G 7/08 |
| | | | | 310/319 |
| 2010/0102782 | A1* | 4/2010 | Thiesen | H02N 2/181 |
| | | | | 320/166 |
| 2010/0253441 | A1* | 10/2010 | Huang | H03H 11/48 |
| | | | | 331/155 |
| 2010/0262308 | A1* | 10/2010 | Anderson | B60G 13/14 |
| | | | | 700/287 |
| 2012/0068574 | A1 | 3/2012 | Wu et al. | |
| 2012/0153773 | A1 | 6/2012 | Lee | |
| 2013/0043762 | A1* | 2/2013 | Ludois | H02K 19/12 |
| | | | | 310/219 |

OTHER PUBLICATIONS

Cammarano et al., "Tuning a resonant energy harvester using a generalized electrical load," Smart Mater. Struct., 2010, vol. 19: pp. 1-7.

Cassidy et al., "Optimization of partial-state feedback for vibratory energy harvesters subjected to broadband stochastic disturbances," Smart Mater. Struct., 2011, vol. 20: pp. 1-13.

Schlecht et al., "Active Power Factor Correction for Switching Power Supplies," IEEE Transactions on power Electronics, Oct. 1987, vol. PE-2(4): pp. 273-281.

Williams et al., "Analysis of a micro-electric generator for microsystems," Sensors and Actuators A, 1996, vol. 52: pp. 8-11.

Scruggs, et al., "An optimal stochastic control theory for distributed energy harvesting networks", J. Sound Vib. vol. 320, Issue 4-5, 2009, pp. 707-725.

Liu, et al., "Active piezoelectric energy harvesting: General principle and experimental demonstration", J Intel Mat Syst Str vol. 20, Issue:5, 2009, pp. 575-585.

Mitcheson, et al., "Tuning the Resonant Frequency and Damping of an Electromagnetic Energy Harvester Using Power Electronics", IEEE Transactions on Circuits and Systems-II: Express Briefs, vol. 58, No. 12, Dec. 2011, 5 pages.

* cited by examiner

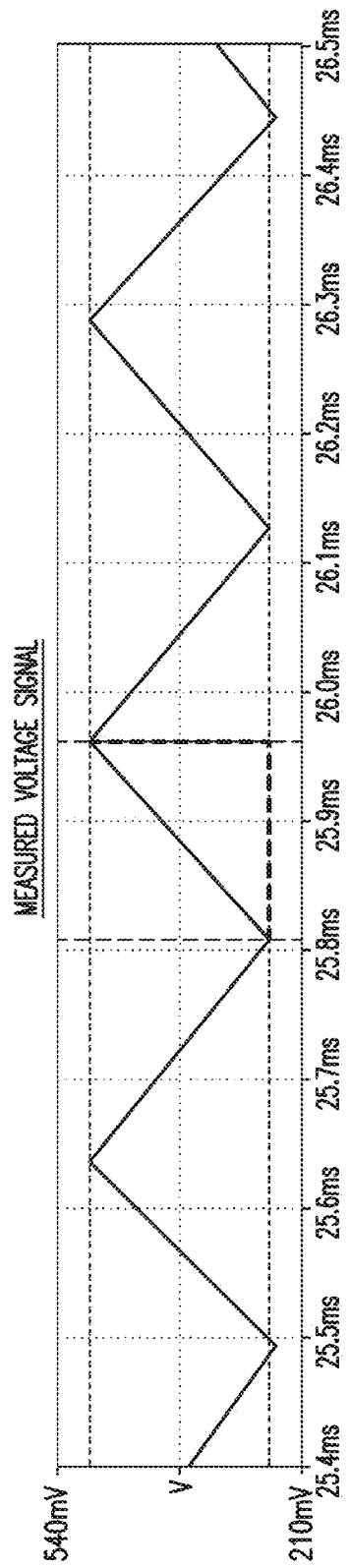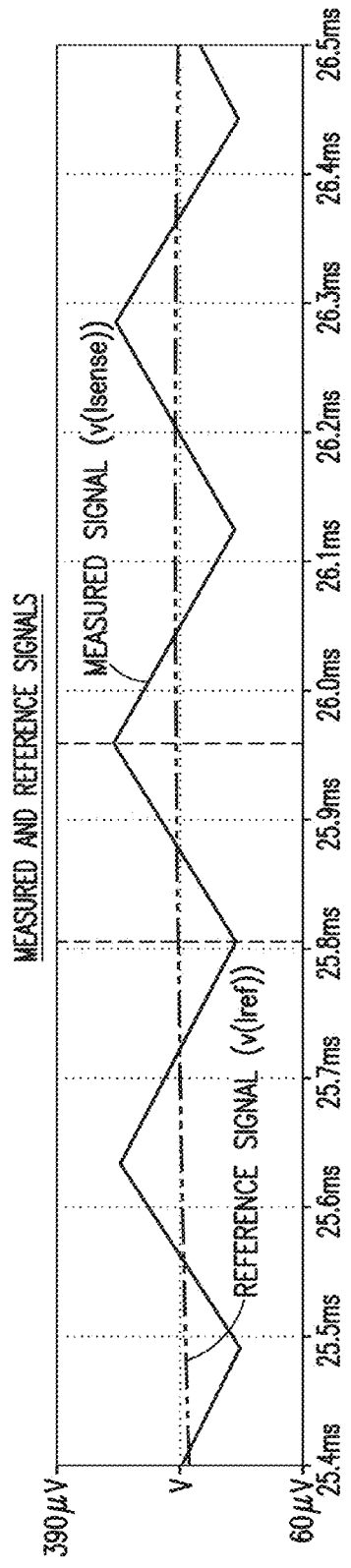

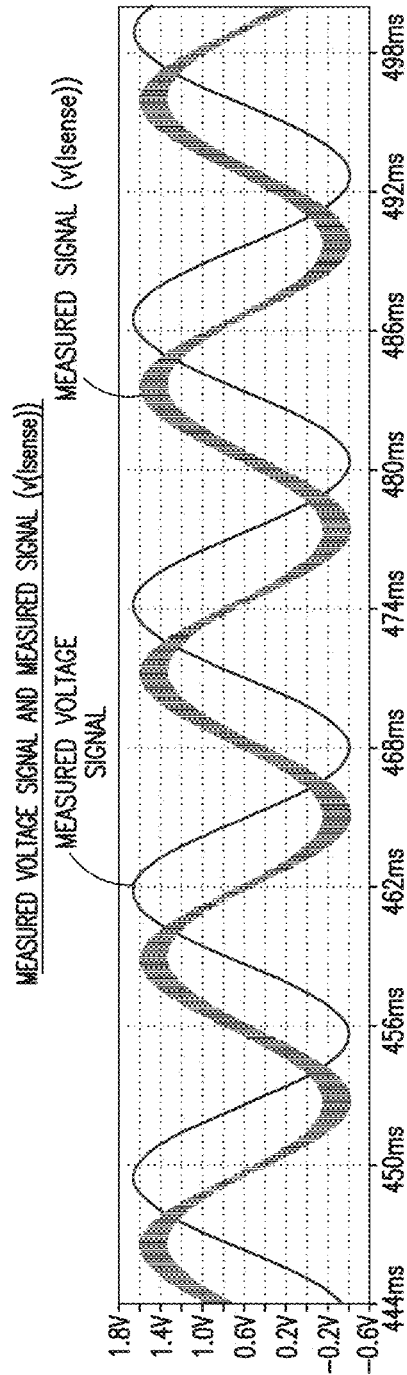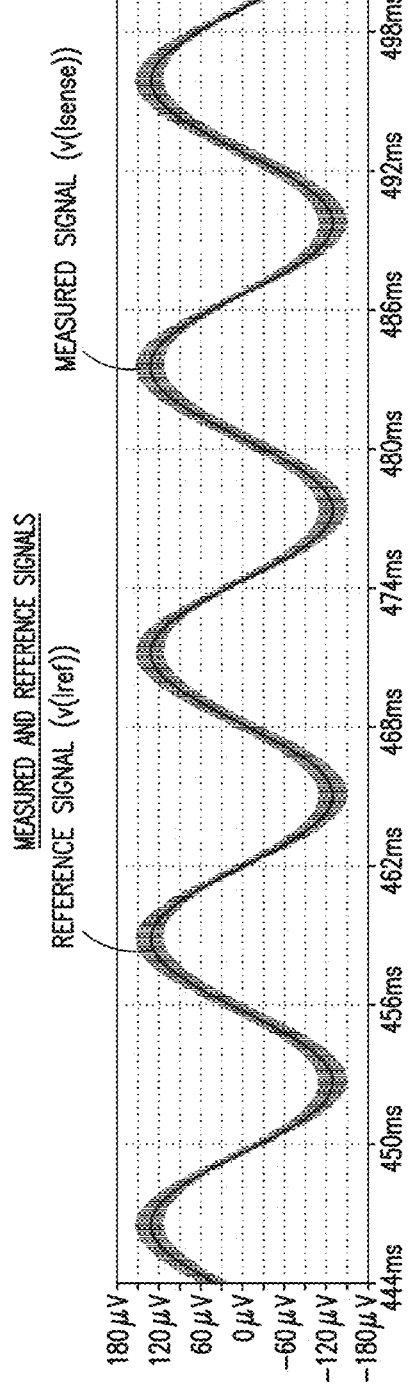

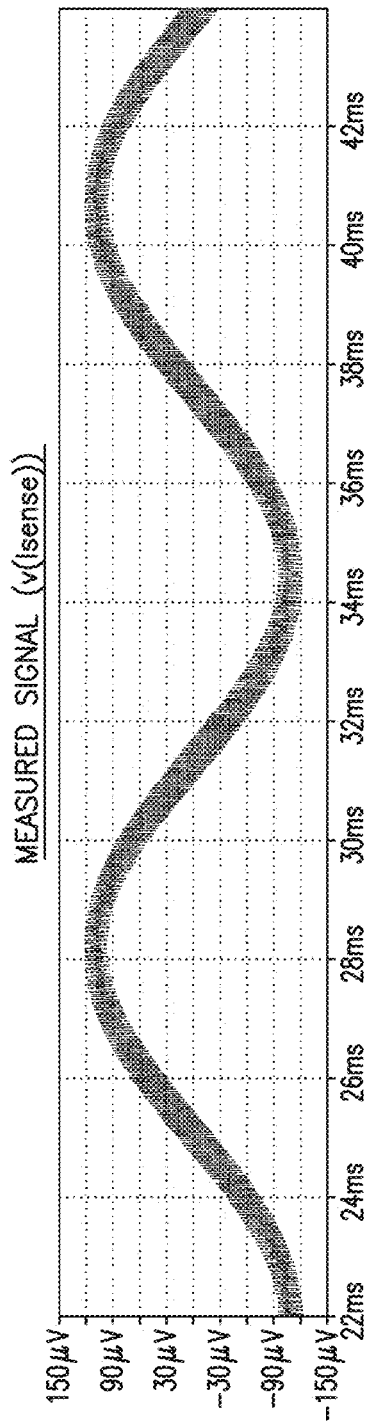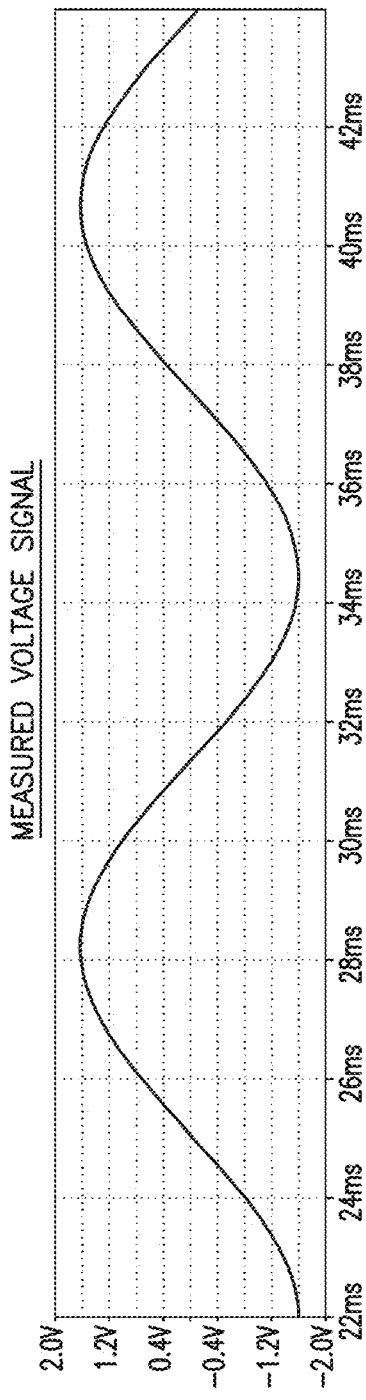

NON-STATIONARY MULTI-FREQUENCY VIBRATION ENERGY HARVESTING WITH TUNABLE ELECTRICAL IMPEDANCE

CROSS-REFERENCE TO RELATED APPLICATION

The present application claims the benefit of U.S. Provisional Patent Application Ser. No. 61/674,715, entitled "Non-stationary Multi-frequency Vibration Energy Harvesting with Tunable Electrical Impedance," filed on Jul. 23, 2012, herein incorporated by reference in its entirety.

FIELD

The present application relates generally to harvesting energy. More particularly, the present application relates to energy harvesting systems capable of harvesting energy from non-ideal vibration conditions.

BACKGROUND

In order to recover natural resources from subterranean formations it is often necessary to perform tasks related to exploration, monitoring, maintenance and construction in remote locations that are either difficult or impractical for personnel to reach directly. For example, boreholes may be drilled tens of thousands of meters into the earth, and in the case of offshore drilling; the borehole may be thousands of meters under water. One of the technical challenges to performing tasks in such remote locations is providing power to equipment. It is known to power downhole and undersea equipment via stored energy or wireline connection to the surface. However, both of these techniques have disadvantages. For example, a wireline connection to the surface limits that distance at which the equipment can operate relative to the energy source, and may require a relatively significant portion of the limited volume of a borehole. Using stored energy avoids some of the disadvantages of a wireline connection to the surface, but relatively little energy can be stored in comparison to requirements because of size limitations. For example, the available volume in a borehole environment is small. Further, both wireline connections to the surface and stored energy techniques require the presence of operators, e.g., a surface vessel to either provide the wireline energy or recharge the energy storage means.

Various techniques associated with energy production are known. Vibration energy harvesting can be accomplished by developing relative motion, and hence energy, between a vibrating structure and a reaction mass coupled to the structure. Vibration energy harvesting involves the creation of some physical structure that can couple in kinetic energy from vibrations and convert the kinetic energy into storable electric energy. Most harvesters are modeled as single degree-of-freedom second-order spring-mass-damper systems as shown in FIG. 1 and first described by Williams et al., "Analysis of a micro-electric generator for Microsystems," Sens. Actuators A, Phys., vol. 52, no. 1-3, pp. 8-11, 1996.

Due to the growing demand of autonomous sensors that function without the need for human intervention, interest in this topic has grown rapidly in recent years.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

In an embodiment of the subject disclosure, an apparatus for converting vibrational energy to electrical energy is disclosed. The apparatus comprises: a vibrational energy harvester having a transducer for generating time-varying electrical signals in response to environmental vibration; at least one power storage device; a switching network operably coupled between the transducer of the vibrational energy harvester and the at least one power storage device, wherein the switching network includes a plurality of switching elements each defining a switchable current path that is controlled by a control signal supplied to the respective switching element; and electronics configured to generate the control signals for supply to the switching elements of the switching network, the electronics including first circuitry, second circuitry, third circuitry, and fourth circuitry; wherein the first circuitry is configured to generate a measured signal representing magnitude and phase of current flowing through the switching elements of the switching network between the transducer of the energy harvester and the at least one power storage device; wherein the second circuitry is configured to generate a reference signal representing magnitude and phase of a current characteristic of a desired effective impedance of the switching network; wherein the third circuitry is configured to generate an error signal based on the difference between the reference signal and the measured signal; wherein the fourth circuitry is configured to generate the control signals supplied to the switching elements of the switching network, wherein the control signals are based on the error signal and control operation of the switching elements of the switching network such that the switching network provides the desired effective impedance; and wherein the second circuitry comprises a voltage sensing stage with an input operably coupled to an output of the transducer of the energy harvester to generate an output signal that represents a measured voltage output by the transducer, and the second circuitry further comprises an integrator stage that integrates an output signal of the voltage sensing stage to generate a signal whose phase lags by 90 degree the phase of the signal output from the voltage sensing stage.

In an embodiment of the subject disclosure, a method for converting vibrational energy to electrical energy is disclosed. The method employs a vibrational energy harvester having a transducer for generating time-varying electrical signals in response to environmental vibration, at least one power storage device, and a switching network operably coupled between the transducer of the vibrational energy harvester and the at least one power storage device, wherein the switching network includes a plurality of switching elements each defining a switchable current path that is controlled by a control signal supplied to the respective switching element, the method comprising: generating a measured signal representing magnitude and phase of current flowing through the switching elements of the switching network between the transducer of the energy harvester and the at least one power storage device; generating a reference signal representing magnitude and phase of a current characteristic of a desired effective impedance of the switching network; generating an error signal based on the difference between the reference signal and the measured signal; and generating control signals supplied to the switching elements of the switching network, wherein the control signals are based on the error signal and control operation of the switching elements of the switching network such that the switching network provides the desired effective impedance; wherein the reference signal is generated by deriving an output signal that represents measured voltage output by the transducer and integrating the output signal to generate a signal whose phase lags by 90 degree the phase of the output signal.

In a further embodiment, an apparatus for converting vibrational energy to electrical energy is disclosed, the apparatus comprising: a vibrational energy harvester having a transducer for generating time-varying electrical signals in response to environmental vibration; at least one power storage device; a switching network operably coupled between the transducer of the vibrational energy harvester and the at least one power storage device, wherein the switching network includes a plurality of switching elements each defining a switchable current path that is controlled by a control signal supplied to the respective switching element; and electronics configured to generate the control signals for supply to the switching elements of the switching network, the electronics configured to control the switching elements to synthesize a reactive load that corresponds to characteristics of the energy harvester.

Further features and advantages of the subject application will become more readily apparent from the following detailed description when taken in conjunction with the accompanying drawings.

BRIEF DESCRIPTION OF THE DRAWINGS

The present application is further described in the detailed description which follows, in reference to the noted plurality of drawings by way of non-limiting examples of embodiments of the present application, in which like reference numerals represent similar parts throughout the several views of the drawings.

FIG. 2 depicts the multi-frequency (multi-harmonic) nature of the vibration.

FIGS. 8A-8H illustrate signal waveforms of an embodiment of the present application corresponding to FIGS. 6 and 7A-7D where the switching network is configured to cause the effective loading of the electrical power storage device to synthesize the impedance characteristics of an inductor.

FIGS. 10A-10D are waveforms that illustrate operations of the power electronics of FIGS. 6, 7A, 7C, 7D and 9 where the switching network is configured to cause the effective loading of the electrical power storage device to synthesize the impedance characteristics of a capacitor.

FIGS. 12A-12C are waveforms that illustrate operations of the power electronics of FIGS. 6, 7A, 7C, 7D and 11 where the switching network is configured to cause the effective loading of the electrical power storage device to synthesize the impedance characteristics of a resistor.

DETAILED DESCRIPTION

The particulars shown herein are by way of example and for purposes of illustrative discussion of the embodiments of the present application only and are presented in the cause of providing what is believed to be the most useful and readily understood description of the principles and conceptual aspects of the present application. In this regard, no attempt is made to show structural details in more detail than is necessary for the fundamental understanding of the present application, the description taken with the drawings making apparent to those skilled in the art how the several forms of the present application may be embodied in practice. Furthermore, like reference numbers and designations in the various drawings indicate like elements.

The embodiments of the present application disclose apparatus and methods for the design, fabrication and testing of an electrically tunable vibration energy harvesting system capable of harvesting energy from non-ideal vibration conditions.

As shown in FIGS. 2A and 2B, real vibration spectra often exhibit multiple and/or non-stationary harmonics, and background random vibrations. The ability to deal with such non-ideal vibration sources has become a technological obstacle to the applicability of vibration energy harvesters.

The embodiments of the present application disclose a tunable electrical circuit that provides a solution to the problem of harvesting from non-ideal multi-harmonic vibrations. This tunable electrical circuit provides a solution to two non-ideal vibrations conditions: the non-stationary behavior of individual vibration harmonics, that is, the slow drift of their frequencies over time; and the multi-harmonic character of the vibration spectra.

Figure 2:
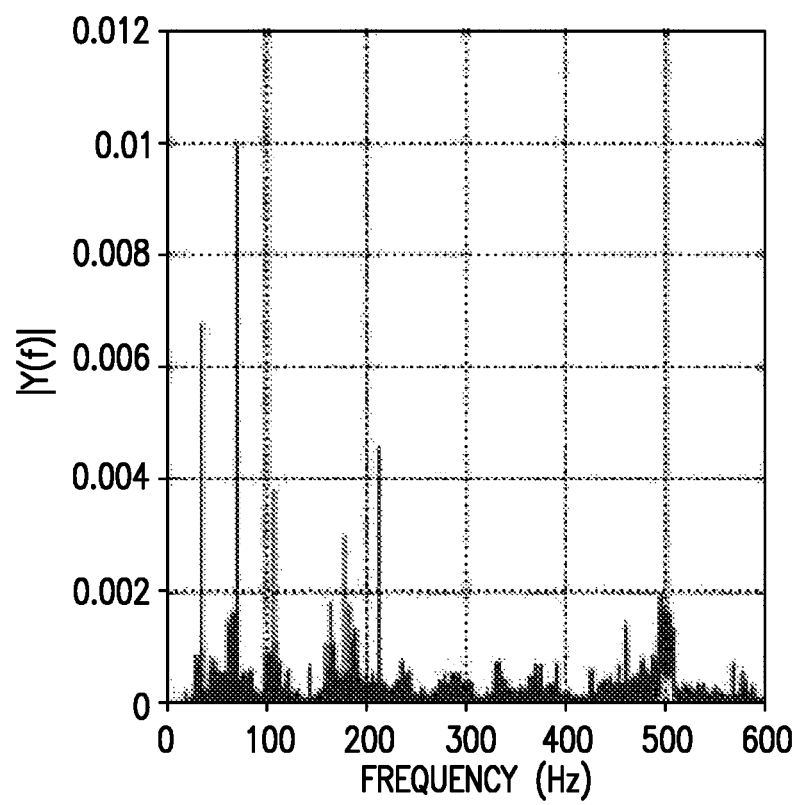
FIG. 2 illustrates non-ideal vibrations recorded from an office window.
Figure 3:
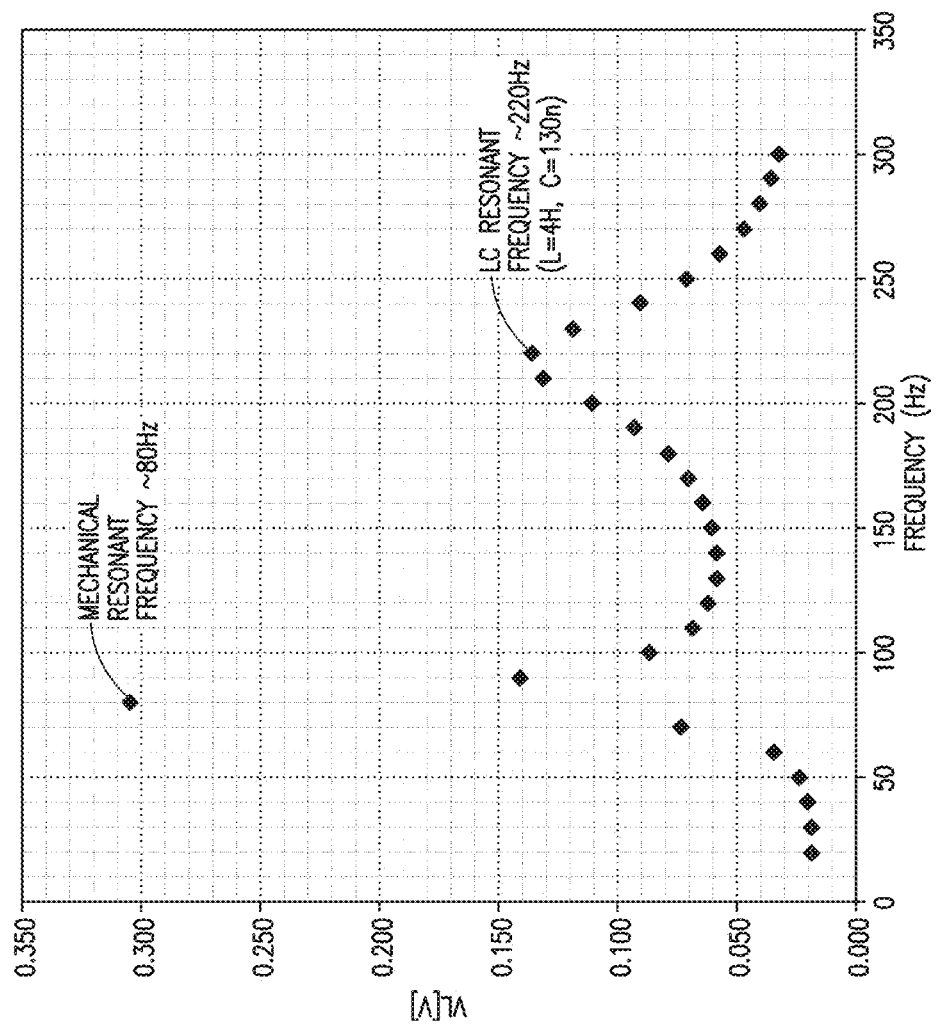
FIG. 3 illustrates the dual-frequency energy harvesting effect of having a RLC loaded energy harvester.
Figure 4:
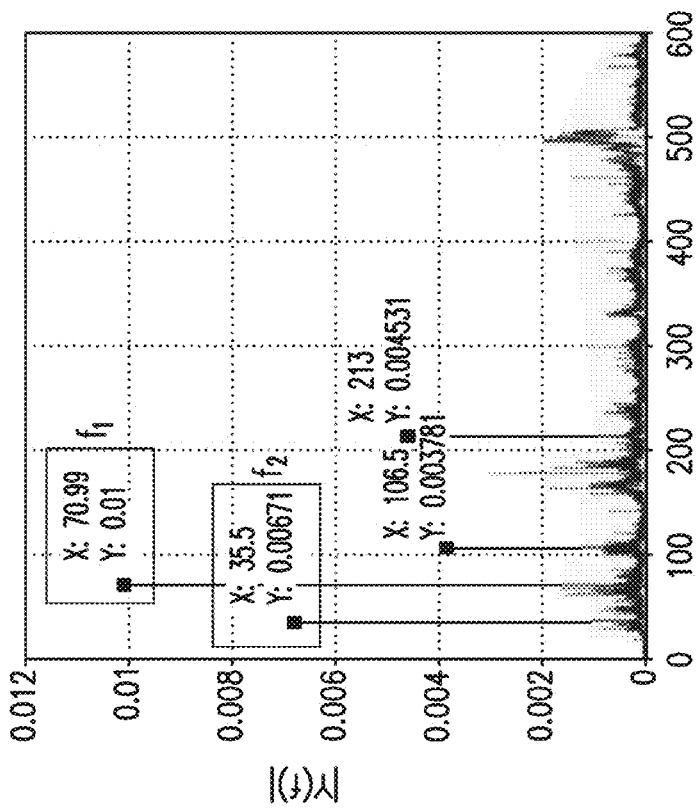
FIG. 4 illustrates non-ideal vibrations applied to a dual-resonant energy harvester as compared to a single resonant energy harvester.

It has been shown that the resonant frequency of a harvester can be electrically tuned by connecting the harvester electrical output to inductors or capacitors. See Cammarano et al., "Tuning a resonant energy harvester using a generalized electrical load," Smart Mater. Struct., Vol. 19, No. 1, p. 055003, 2010. However, dynamic tuning is difficult since it requires adaptively sensing the vibration condition and changing the inductor and capacitor sizes in real time. Specifically, the size of the inductors and capacitors can be dynamically changed to create a multi-resonance effect on a harvester as shown in FIG. 3. FIG. 3 depicts the dual-frequency energy harvesting effect of having a RLC loaded energy harvester. To demonstrate the effect of multi-resonant frequencies, the noisy vibration signal in FIG. 2 is applied to a dual-resonant energy harvester tuned to the two frequencies that have the highest output voltage. In FIG. 4, the output power of the dual-resonant energy harvester is compared with single resonant harvesters tuned to the two frequencies individually and it can be observed that the dual-resonant energy harvester is capable of harvesting the sum energy of the two single harmonic harvesters. However, large inductors are difficult to build and have large power losses which make them unsuitable for lower power applications. In addition, discrete capacitors and inductors cannot be tuned dynamically when the vibration conditions change.

Figure 5:
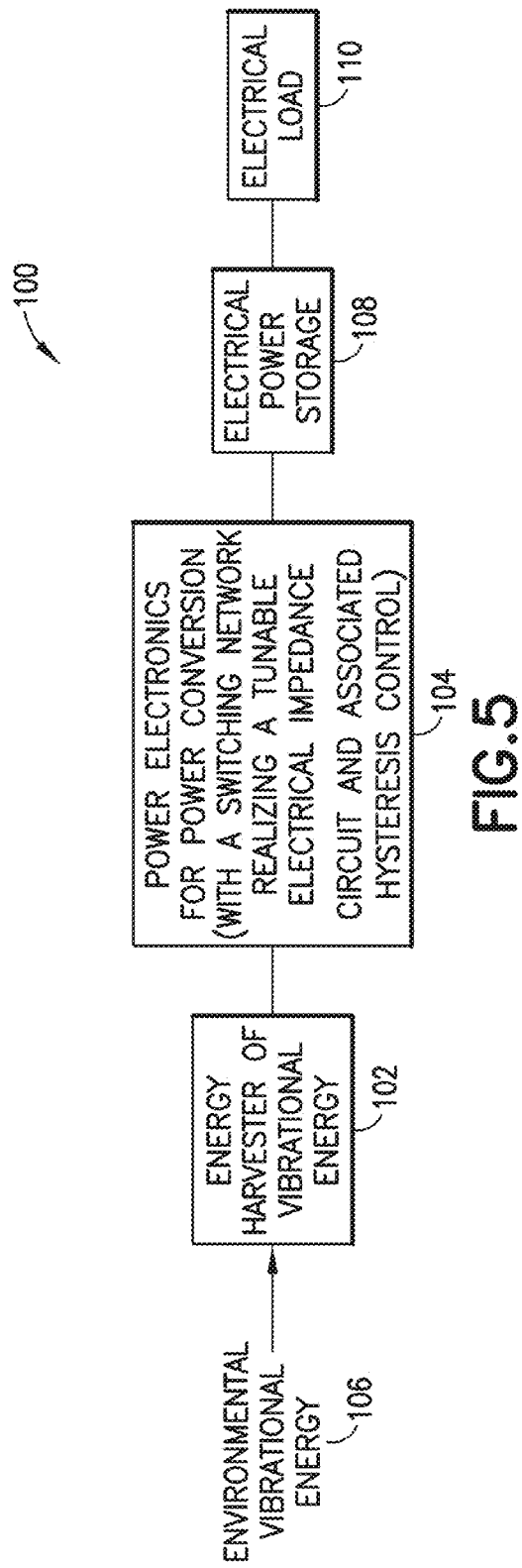
FIG. 5 is a functional block diagram of a system that converts environmental vibrational energy into electrical energy for storage in at least one electrical power storage device in accordance with embodiments described herein.

FIG. 5 is a schematic diagram of a system in accordance with the present application. The system 100 includes an energy harvester 102 that cooperates with power electronics 104 to convert environmental vibrational energy 106 into electrical energy that is stored in one or more electrical power storage devices 108. For example, the electrical power storage device(s) 108 can be realized by one or more capacitors (or batteries) that store electrical energy and output the stored electrical energy as DC voltage (current). The electrical energy stored by the electrical power storage device(s) 108 can be supplied to one or more electrical loads 110 for powering the electrical loads. Such supply can involve conversion of the electrical energy output from the electrical power storage device(s) 108 into a form suitable for consumption by the electrical loads 110. For example, DC voltage (current) output by the electrical power storage device(s) 108 can be converted into other DC voltage (current) signals (i.e., up-converted or down-converted) and/or possibly converted to AC voltage (current) power signals (such as standard 110V AC or 220V AC power signals).

Figure 1:
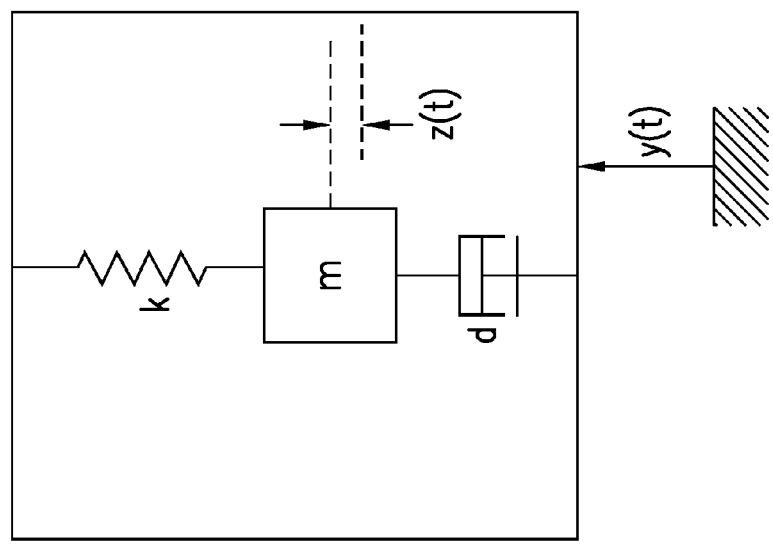
FIG. 1 illustrates a generic spring-mass-damper of a vibration-based energy harvester.

The energy harvester 102 can be realized by a wide variety of structures. For example, it can include a transducer of inertial mass m attached by a structural spring of a static spring constant k to a vibrating structure secured to a reference frame as shown in the schematic diagram of FIG. 1. The transducer can be an electromechanical transducer realized by one or more coils attached to the inertial mass, and one or more magnets attached to the vibrating structure. Alternatively, the transducer can be an electromechanical transducer realized by one or more magnets attached to the inertial mass, and one or more coils attached to the vibrating structure. Environmental vibration from a vibration source causes the transducer to oscillate and thus causes the coil(s) to cut through and interact with flux formed by the magnet to generate current oscillations in the coil(s). In other embodiments, the energy harvester 102 can employ a piezoelectric transducer or an electrostatic transducer.

In accordance with the present application, the power electronics 104 employs a switching network that provides a tunable electrical impedance and high efficiency. The switching network includes a set of switching elements that provide a number of switchable bidirectional current paths between the energy harvester 102 and the electrical power storage device(s) 108. The switching elements each include a control electrode as well as a pair of terminal electrodes with a low resistance switchable current path therebetween. The control electrodes of the switching elements are supplied with control signals that selectively operate the switching elements in one of two states: a conducting ON state where there is a low-resistance current path between the terminal electrodes of the respective switching element, and a non-conducting OFF state where there is no low-resistance current path between the terminal electrodes of the respective switching element (in other words, there is minimal or no current conduction through the current path between the terminal electrodes of respective switching element in the OFF state). The power electronics 104 further includes a hysteresis control circuit that is configured to generate the control signals supplied to control electrodes of the switching elements such that the ON/OFF states of the switching elements are modulated in a manner such that the effective loading of the electrical power storage device(s) 108 synthesizes (or emulates) desired impedance. In one embodiment, the synthesized impedance can represent the electrical characteristics of an inductor, capacitor, or resistor (or a combination of these components to form a generalized load). For example, the synthesized impedance can represent the electrical characteristics of an inductor and/or a capacitor.

Figure 6:
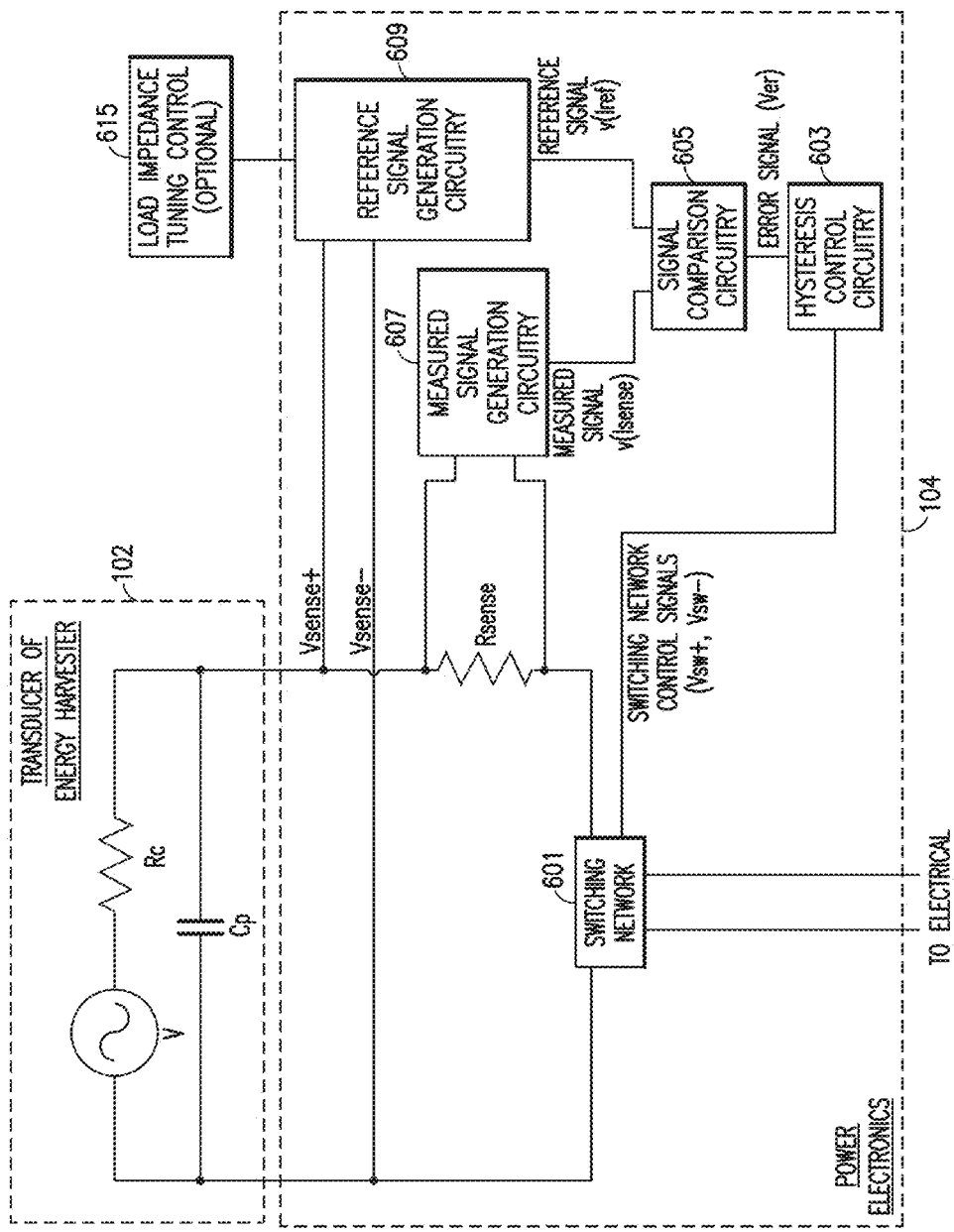
FIG. 6 illustrates an embodiment of the present application.

In one non-limiting example shown in FIG. 6, the power electronics 104 includes a switching network 601 with a set of switching elements (for example, see FIG. 7A) that provide a number of switchable bidirectional current paths between the energy harvester 102 and the electrical power storage device(s) 108. A hysteresis control circuit 603 is configured to generate digital control signals ($V_{sw+}$, $V_{sw-}$) supplied to control electrodes of the switching elements of the switching network 601. More specifically, the hysteresis control circuit 603 operates under control of an error signal ($V_{er}$) that represents the difference between a measured signal ($v(I_{sense})$) and a reference signal ($v(I_{ref})$) as produced by signal comparison circuitry 605. The measured signal ($v(I_{sense})$) represents the magnitude and phase of the current flowing through switching elements of the switching network 601 between the energy harvester 102 and the electrical power storage device(s) 108. The measured signal (v($I_{sense}$)) is produced by measured signal generation circuitry 607 according to the voltage drop across a resistor ($R_{sense}$) that lays in the current path between the energy harvester 102 and the electrical power storage device(s) 108. The reference signal (v($I_{ref}$)) is a voltage signal that represents the magnitude and phase of a target current flow between the energy harvester 102 and the electrical power storage device(s) 108 for a desired impedance loading. The reference signal (v($I_{ref}$)) can be produced by the reference signal generation circuitry 609 according to the differential voltage ($V_{sense+}-V_{sense-}$) output by the energy harvester 102. The hysteresis control circuit 603 is configured to generate the digital control signals ($V_{sw+}$, $V_{sw-}$) such that the ON/OFF states of the switching elements of the switching network 601 are modulated in a manner that drives the error signal ($V_{er}$) toward zero, which causes the effective loading of the electrical power storage device 108 to synthesize the desired impedance loading. In one embodiment, the synthesized impedance can represent the electrical characteristics of an inductor, capacitor, or resistor (or a combination of these components to form a generalized load). For example, the synthesized impedance can represent the electrical characteristics of an inductor and/or a capacitor.

Figure 7A:
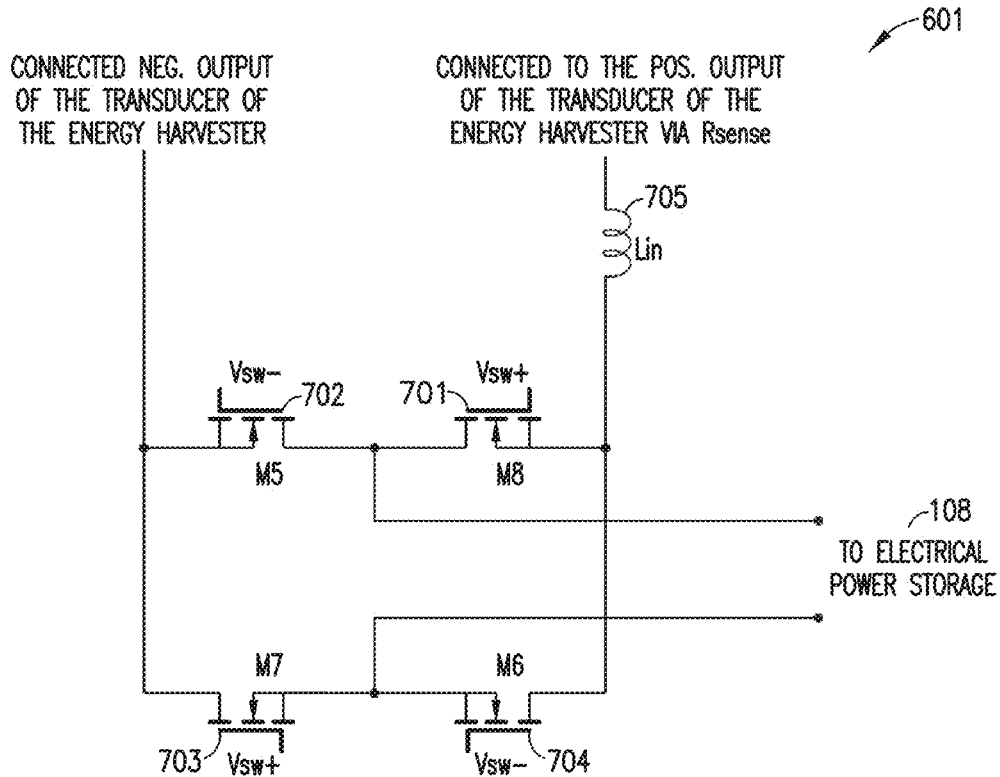
FIG. 7A illustrates an embodiment of the switching network of FIG. 6.

FIG. 7A illustrates a non-limiting embodiment of the switching network 601 of FIG. 6, where the switching elements are realized by a set of four transistors 701, 702, 703, 704 that form an H-bridge configuration as well as a current smoothing inductor 705 as shown. The transistors 701, 702, 703, 704 each include a gate control electrode as well as source and drain electrodes with a switchable current path therebetween. The transistors 701, 702, 703, 704 can be realized by MOSFET transistors or other devices suitable for the current and voltage levels of the system. For example, the transistors 701, 702, 703, 704 can be realized by FDV301N digital nMOS transistors sold commercially by Fairchild Semiconductor of San Jose, Calif. The FDV301N digital nMOS transistor has a low on-state resistance of 5 ohms and low input capacitance of 9.5 p. In addition, it can withstand a drain-to-source voltage of 25 V. This is necessary for multi-frequency harvesting as described herein as the output voltages add up when multiple vibration frequencies excite the harvester at the same time. In the H-bridge configuration, the transistors 701 and 702 are series coupled to one another for one leg of the H with their common node coupled to the positive terminal of the electrical power storage 108, and the transistors 703 and 704 are series coupled to one another for the other leg of the H with their common node coupled to the negative terminal of the electrical power storage 108. The electrical coupling of the two legs to the electrical power storage 108 forms the center of the H. The source/drain current paths for the transistors 701 and 704 are operably coupled to the positive output of the energy harvester 102 via the current smoothing inductor 705, and the source/drain current paths for the transistors 702 and 703 are operably coupled to the negative output of the energy harvester 102. The ON/OFF states of the transistors 701, 702, 703, 704 are controlled by the digital control signals supplied to the respective gate control electrodes of the transistors. By controlling the duty cycle and switching sequence of the transistors 701, 702, 703, 704, the H-bridge configuration of the transistors 701, 702, 703, 704 can synthesize the desired impedance loading.

In one embodiment, the ON/OFF switching of transistors 701 and 703 is operated by the digital control signal $V_{sw+}$ and is in antiphase with respect to the ON/OFF switching of transistors 702 and 704 as operated by the digital control signal $V_{sw-}$. In this configuration, the binary logic level of the digital control signal $V_{sw+}$ is complementary to the binary logic level of the digital control signal $V_{sw-}$. The hysteresis control circuit 603 employs a positive threshold error value and a negative threshold error value. When the error signal ($V_{er}$) falls between the positive threshold error value and the negative threshold error value, the binary logic levels of digital control signals $V_{sw+}$, $V_{sw-}$ remain unchanged. When the rising error signal ($V_{er}$) crosses the positive threshold error value, the binary logic levels of digital control signals $V_{sw+}$, $V_-$ are updated to drive the error signal ($V_{er}$) in the opposite direction toward negative polarity. When the falling error signal ($V_{er}$) crosses the negative threshold error value, the binary logic levels of digital control signals $V_{sw+}$, $V_{sw-}$ are updated to drive the error signal ($V_{er}$) in the opposite direction toward positive polarity. In this manner, the hysteresis control circuit 603 drives the error signal ($V_{er}$) toward zero while avoiding oscillation and resulting system instability. The positive threshold error value and the negative threshold error value employed by the hysteresis control circuit 603 can be fixed by design. In one embodiment, the positive threshold error value and the negative threshold error value can be set to values that correspond to +15%/-15% of the magnitude range of the error signal ($V_{er}$). In setting these limits, there is a tradeoff between switching frequency of the digital control signals $V_{sw+}$, $V_{sw-}$ and the width of the error band between the positive threshold error value and the negative threshold error value. Specifically, a narrower error band requires a faster switching frequency of the digital control signals $V_{sw+}$, $V_{sw-}$.

Figure 7C:
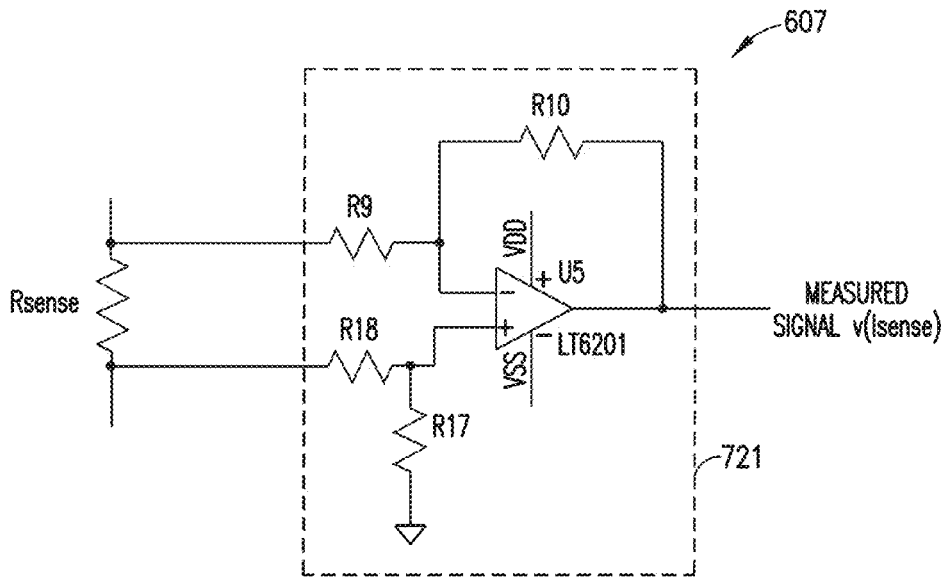
FIG. 7C illustrates an embodiment of the measurement signal generation circuitry of FIG. 6.
Figure 7B:
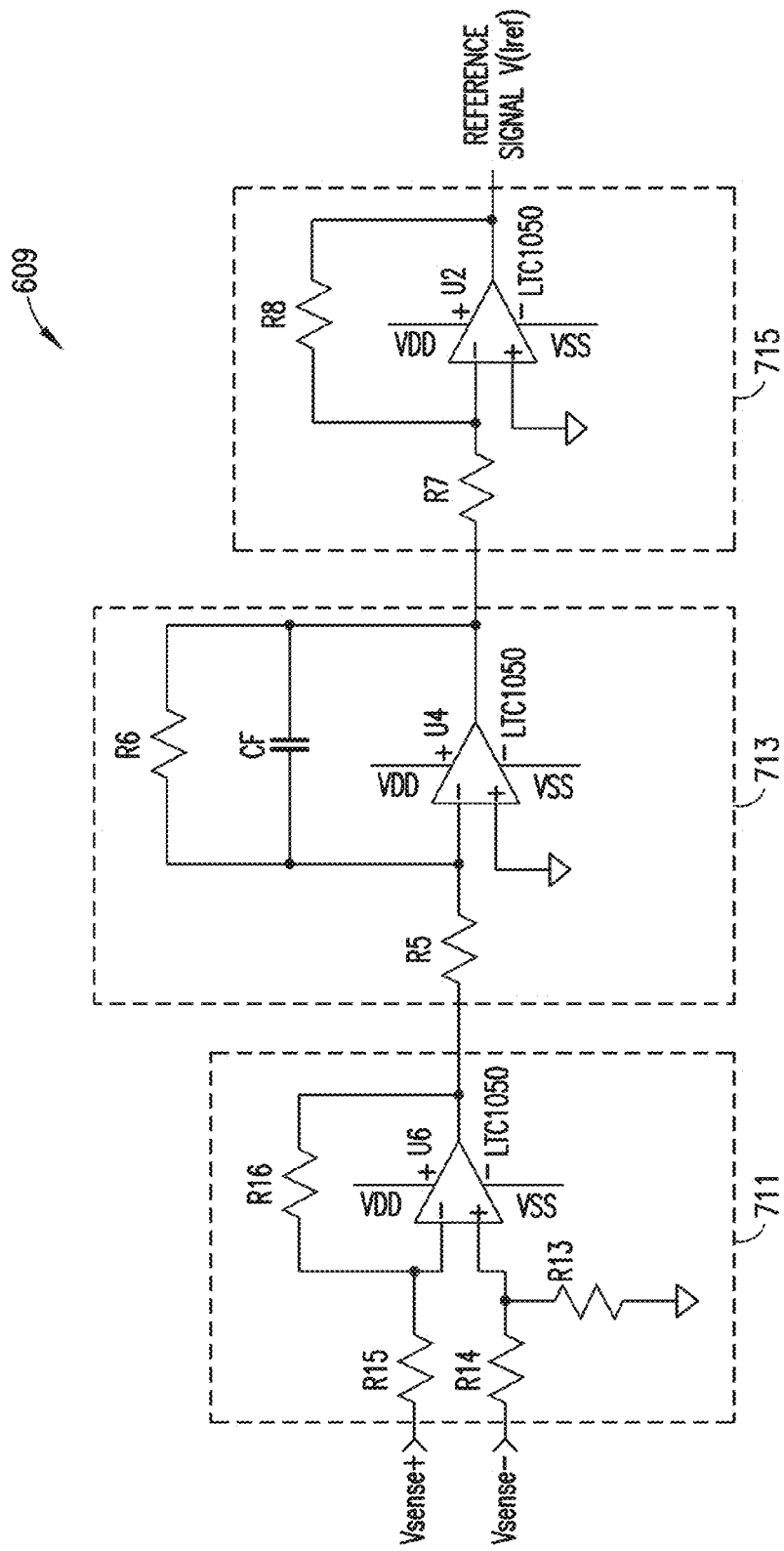
FIG. 7B illustrates an embodiment of the reference signal generation circuitry of FIG. 6 suitable for controlling the switching network to synthesize an inductive load.

FIG. 7B illustrates a non-limiting embodiment of the reference signal generation circuitry 609 of FIG. 6. It includes a series arrangement of three signal processing stages 711, 713 and 715 that generate the reference signal (v($I_{ref}$)), which in this case represents the magnitude and phase of a target current flow between the energy harvester 102 and the electrical power storage device(s) 108 for a desired inductance loading. The first stage 711 senses (measures) the differential voltage signal ($V_{sense+}-V_{sense-}$) between the positive and negative outputs of the energy harvester 102 and converts the differential voltage signal to a single-ended voltage signal (possibly with some negative or positive gain) that is output to the second stage 713. The first stage 711 can be realized by a differential amplifier op-amp circuit as shown in FIG. 7B. Other suitable circuits can also be used. The second stage 713 performs integration of the voltage signal produced by the first stage 711 to produce a voltage waveform whose phase lags the phase of the voltage signal produced by the first stage 711 by ninety degrees. The second stage 713 can be realized by an integrator amplifier op-amp circuit as shown in FIG. 7B. Other suitable circuits can also be used. The third stage 715 performs amplification of the voltage waveform produced by the second stage 713 (with positive or negative gain) to provide control over the total effective gain of stages 711 to 715. The voltage waveform produced by the third stage 715 is the reference signal (v($I_{ref}$)), which represents the magnitude and phase of a target current flow between the energy harvester 102 and the electrical power storage device(s) 108 for a desired impedance loading. The third stage 715 can be realized by an inverting amplifier op-amp circuit as shown in FIG. 7B. Other suitable circuits can also be used. For example, it is contemplated that the gain stage 715 can be omitted in some designs. The total effective gain of stages 711, 713 and 715 (if used) is proportional to the ratio of the peak magnitude of the average differential voltage signal ($V_{sense+}-V_{sense-}$) to the peak magnitude of the average measured signal ($v(I_{sense})$) and corresponds to the size of the inductance synthesized by the operation of the switching network. For example, the total effective gain can be configured such that the peak magnitude of the average differential voltage signal ($V_{sense+}-V_{sense-}$) is 480 µV and the peak magnitude of the average measured signal ($v(I_{sense})$) is 240 µA at a resonance, which provides a ratio that corresponds to a synthesized inductance of 4 H.

FIG. 7C illustrates a non-limiting embodiment of the measured signal generation circuitry 607 of FIG. 6. It includes a stage 721 that measures the differential voltage across the resistor $R_{sense}$ that lies in the current path between the positive output of the energy harvester 102 and the switching network, and converts this differential voltage signal (possibly with some negative or positive gain) to a single-ended voltage waveform. The voltage waveform produced by stage 721 is the measured signal ($v(I_{sense})$), which represents the magnitude and phase of the current flowing through the transistors 701, 702, 703, and 704 of the switching network between the energy harvester 102 and the electrical power storage device(s) 108. The stage 721 can be realized by a differential amplifier op-amp circuit as shown in FIG. 7C. Other suitable circuits can also be used.

Figure 7D:
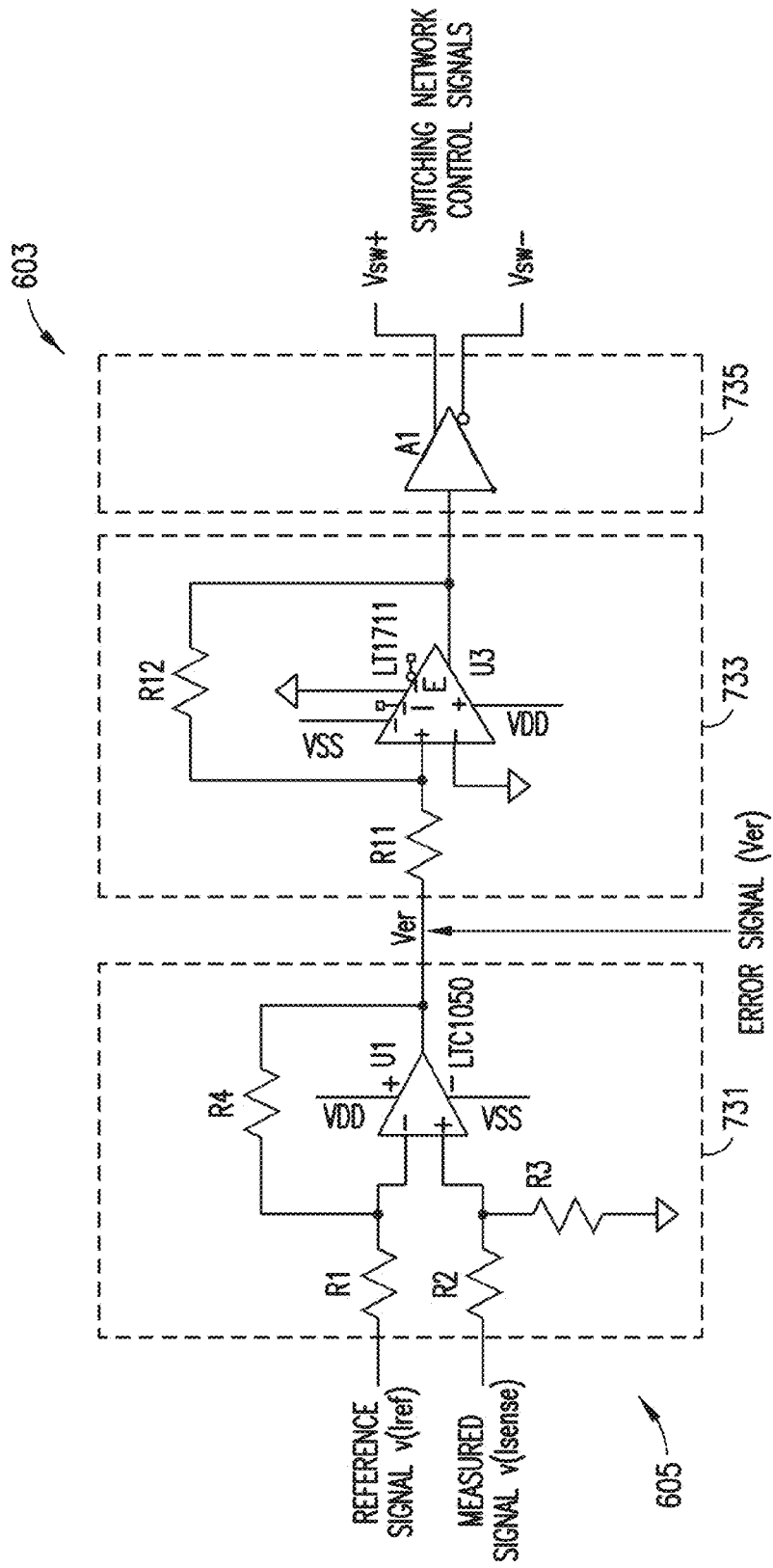
FIG. 7D illustrates an embodiment of the signal comparison circuitry and hysteresis control circuitry of FIG. 6.

FIG. 7D illustrates a non-limiting embodiment of the signal comparison circuitry 605 and the hysteresis control circuitry 603 of FIG. 6. The signal comparison circuitry 605 includes a stage 731 that generates an error signal ($V_{er}$) that represents the difference between the measured signal ($v(I_{sense})$) produced by the measured signal generation circuitry 607 and the reference signal ($v(I_{ref})$) produced by the reference current signal generation circuitry 609. The stage 731 can be realized by a differential amplifier op-amp circuit as shown in FIG. 7D. Other suitable circuits can also be used. The hysteresis control circuitry 603 includes stages 733 and 735. Stage 733 is configured to change its output state when the error signal ($V_{er}$) crosses through approximately zero volts. The switching of stage 733 employs hysteresis in order to avoid oscillation and resulting system instability. Stage 733 can be realized by a comparator circuit as is well known in the electronic arts. Stage 735 produces the digital control signals ($V_{sw+}$, $V_{sw-}$) for controlling the transistors 701, 702, 703, 704 of the switching network based on the state of the output of stage 733. Stage 735 can be realized by suitable line driver logic with complementary digital outputs as is well known in the electronic arts. For example, stage 735 can be realized by the LTC44463 gate driver sold commercially by Linear Technology Corp. of Milpitas, Calif. Other suitable circuitry can also be used.

FIGS. 8A-8D are waveforms that illustrate operations of the power electronics 104 of FIGS. 6 and 7A-7D where the switching network 601 is configured to cause the effective loading of the electrical power storage device 108 to synthesize the impedance characteristics of an inductor.

Figure 8A:
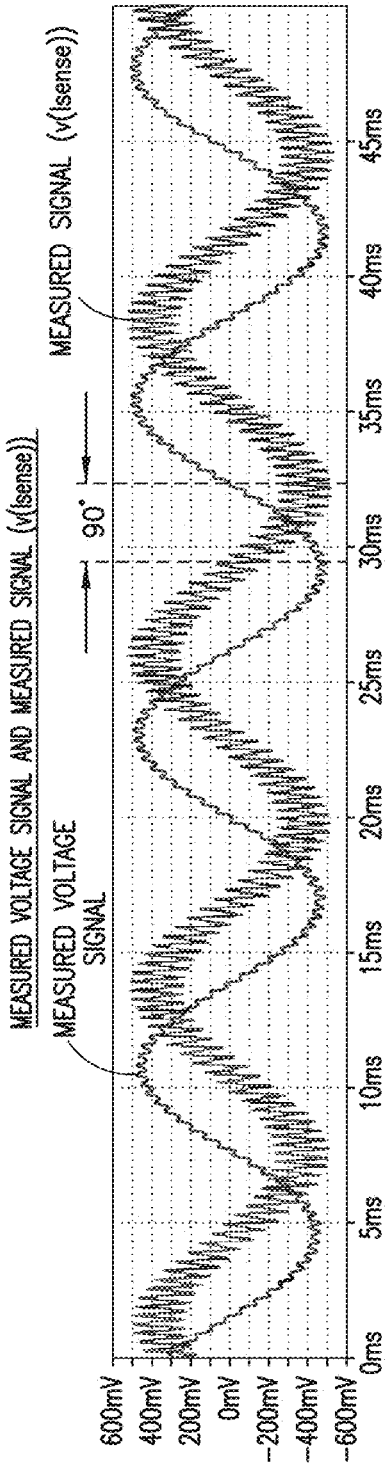

FIG. 8A shows the voltage waveform (labeled "measured voltage signal") produced by the first stage 711 of the current signal generation circuitry of FIG. 7B as well as the voltage waveform (labeled "measured signal ($v(I_{sense})$)") produced by stage 721 of the measured signal generation circuitry of FIG. 7C.

Figure 8B:
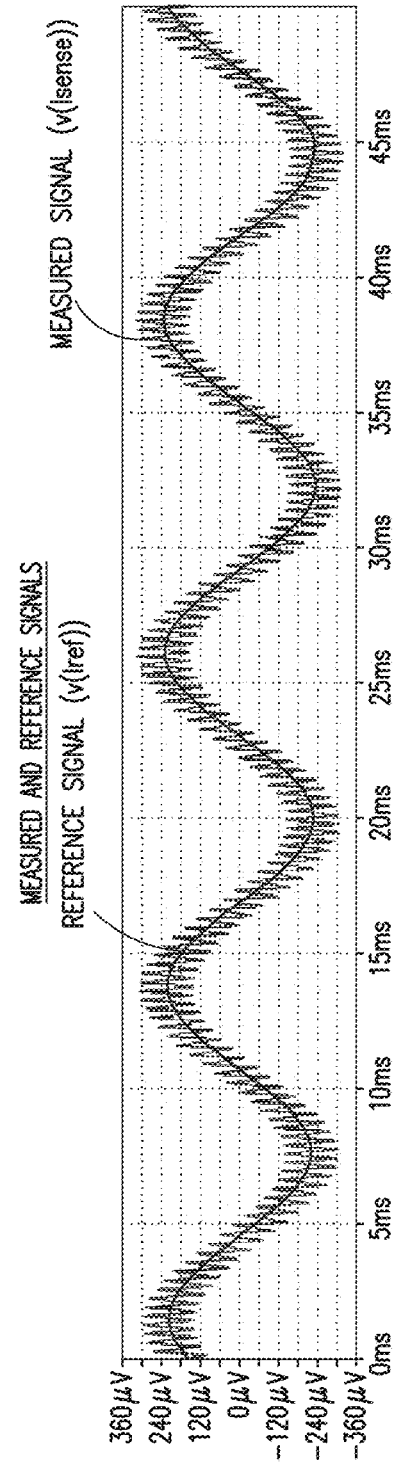

FIG. 8B shows the voltage waveform (labeled "measured signal ($v(I_{sense})$)") produced by stage 721 of the measured signal generation circuitry of FIG. 7C as well as the waveform (labeled "reference signal ($v(I_{ref})$)" produced by the third stage 715 of the reference signal generation circuitry of FIG. 7B. Note that the reference signal ($v(I_{ref})$) of FIG. 8B has a phase that lags the phase of the measured signal ($v(I_{sense})$) of FIG. 8A by 90 degrees. In this configuration, the switching network causes the effective loading of the electrical power storage device 108 to synthesize the impedance characteristics of an inductor.

Figure 8C:
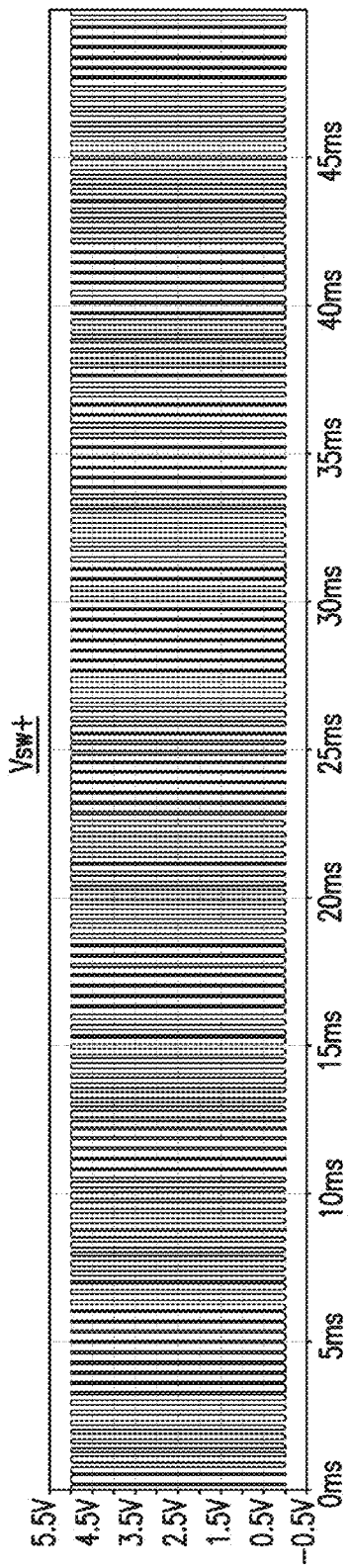

FIG. 8C shows the voltage waveform $V_{sw+}$ generated by the stage 733 of the hysteresis control circuitry 603 to control the ON/OFF states of the transistors 701 and 703 of the switching network.

Figure 8D:
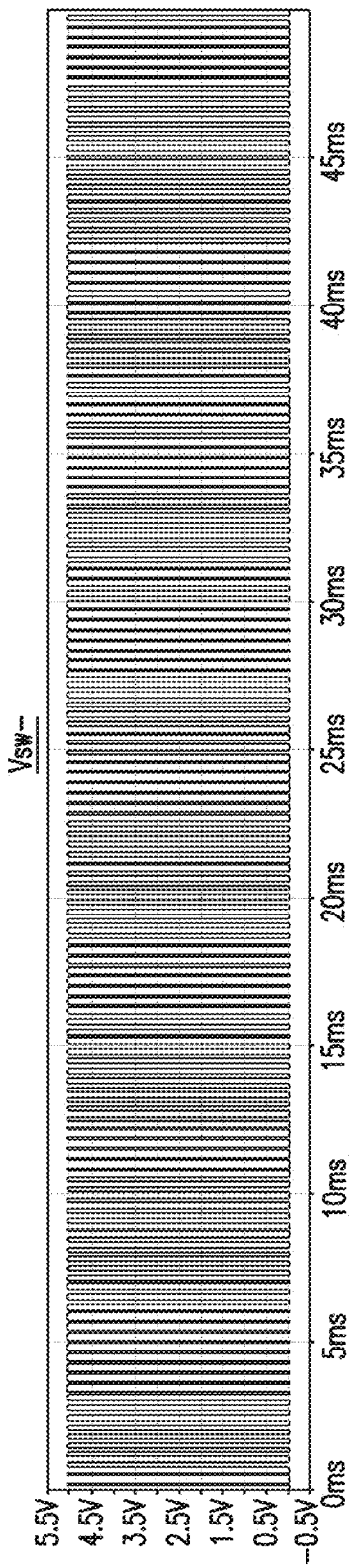

FIG. 8D shows the voltage waveform $V_{sw-}$ generated by the stage 733 of the hysteresis control circuitry 603 to control the ON/OFF states of the transistors 702 and 704 of the switching network.

FIG. 8E is a high resolution view of a portion of the voltage waveform (labeled "measured voltage signal") of FIG. 8A, which is produced by the first stage 711 of the reference current signal generation circuitry of FIG. 7B.

FIG. 8F is a high resolution view of portions of the voltage waveforms (labeled "measured signal ($v(I_{sense})$)" and reference signal ($v(I_{ref})$)") of FIG. 8B, which are produced by stage 721 of the measured signal generation circuitry of FIG. 7C and the third stage 715 of the reference signal generation circuitry of FIG. 7B.

Figure 8G:
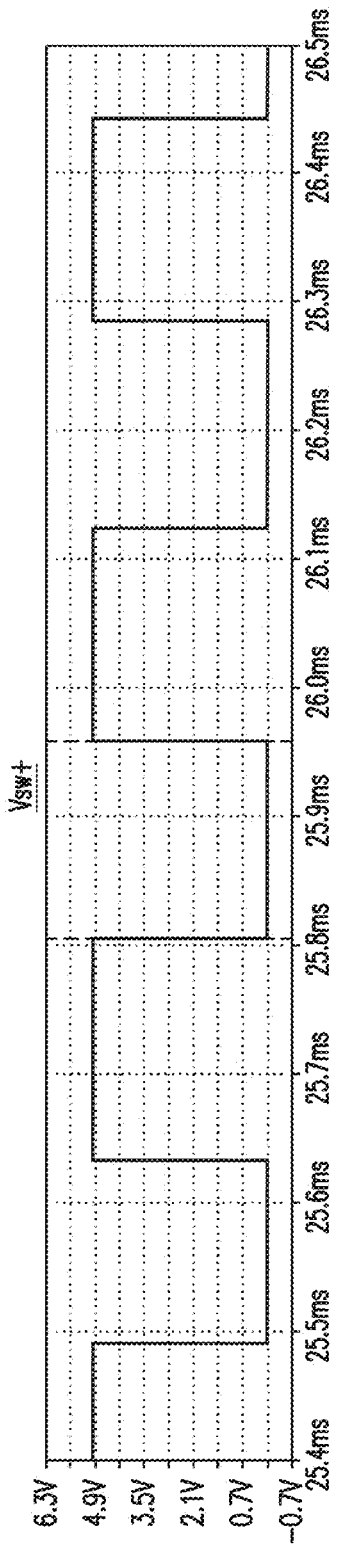

FIG. 8G is a high resolution view of a portion of the voltage waveform $V_{sw+}$ of FIG. 8C, which is generated by the stage 733 of the hysteresis control circuitry 603 to control the ON/OFF states of the transistors 701 and 703 of the switching network.

Figure 8H:
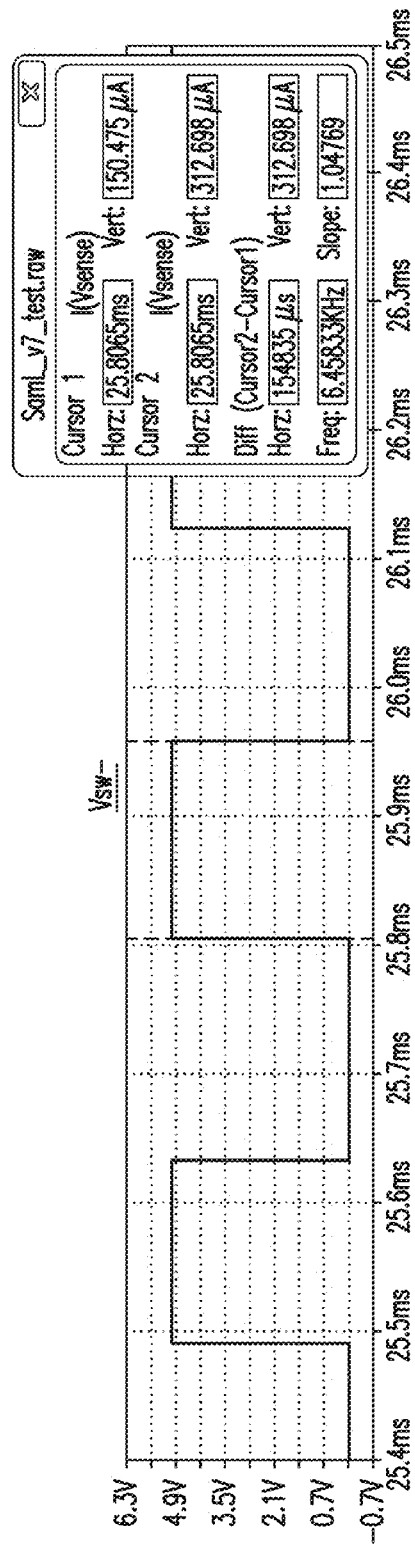

FIG. 8H is a high resolution view of a portion of the voltage waveform $V_{sw-}$ of FIG. 8D, which is generated by the stage 733 of the hysteresis control circuitry 603 to control the ON/OFF states of the transistors 702 and 704 of the switching network.

The reference signal generation circuitry 609 of FIG. 6 can be adapted to generate a reference signal ($v(I_{ref})$) which represents the magnitude and phase of a target current flow between the energy harvester 102 and the electrical power storage device(s) 108 for other impedance loads.

Figure 9:
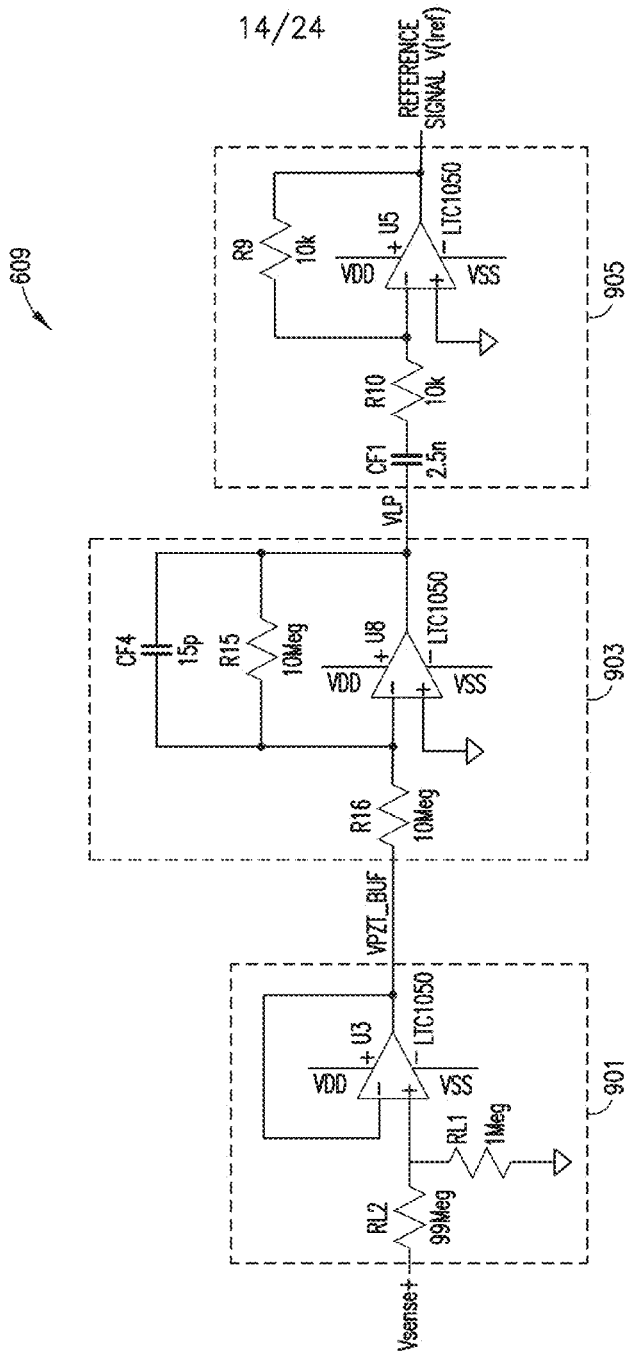
FIG. 9 illustrates another embodiment of the reference signal generation circuitry of FIG. 6 suitable for controlling the switching network and is configured to cause the effective loading of the electrical power storage device to synthesize a capacitive load.

For example, FIG. 9 illustrates a configuration of the reference signal generation circuitry of FIG. 6 suitable for controlling the switching network to synthesize a capacitive load. Specifically, the reference signal generation circuitry is adapted to generate a reference signal ($v(I_{ref})$) which represents the magnitude and phase of a target current flow between the energy harvester 102 and the electrical power storage device(s) 108 for a desired capacitive load. In this case, the reference signal generation circuitry 609 includes a series arrangement of three signal processing stages 901, 903 and 905. The first stage 905 includes a resistor network and op-amp buffer amplifier that output a single-ended voltage signal corresponding to the voltage signal ($V_{sense+}$) at the positive output of the energy harvester 102, and thus senses (measures) the voltage signal ($V_{sense+}$) at the positive output of the energy harvester. Other suitable circuits can also be used (possibly with negative or positive gain). The second stage 903 performs low-pass filtering of the voltage waveform produced by the first stage 901 (possibly with negative or positive gain) such that high-frequency load voltage ripples are filtered out and do not pass to the third stage 905. The third stage 905 performs differentiation of the voltage signal produced by the second stage 903 (possibly with negative or positive gain) to produce a voltage waveform whose phase leads the phase of the voltage signal produced by the first stage 901 by ninety degrees. The third stage 903 can be realized by a differentiator op-amp circuit as shown in FIG. 9. Other suitable circuits can also be used. The voltage waveform produced by the third stage 905 is the reference signal (v($I_{ref}$)), which represents the magnitude and phase of a target current flow between the energy harvester 102 and the electrical power storage device(s) 108 for a desired capacitive loading. The total effective gain of stages 901 to 903 is proportional to the ratio of the peak magnitude of the average measured signal (v($I_{sense}$)) to the peak magnitude of the average measured voltage signal (V$_{sense+}$) and corresponds to the size of the capacitance synthesized by the operation of the switching network. For example, the total effective gain of stages 711 to 715 can be configured such that the peak magnitude of the average measured signal (v($I_{sense}$)) is 135 µA and the peak magnitude of the average measured voltage signal (V$_{sense+}$) is 240 µA, which provides a ratio that corresponds to a synthesized capacitance of 25 F.

FIGS. 10A-10D are waveforms that illustrate operations of the power electronics 104 of FIGS. 6, 7A, 7C, 7D and 9 where the switching network 601 is configured to cause the effective loading of the electrical power storage device 108 to synthesize the impedance characteristics of a capacitor.

FIG. 10A shows the voltage waveform (labeled "measured voltage signal") produced by the first stage 901 of the reference signal generation circuitry of FIG. 9 as well as the voltage waveform (labeled "measured signal (v($I_{sense}$))") produced by stage 721 of the measured signal generation circuitry of FIG. 7C.

FIG. 10B shows the voltage waveform (labeled "measured signal (v($I_{sense}$))") produced by stage 721 of the measured signal generation circuitry of FIG. 7C as well as the voltage waveform (labeled "reference signal (v($I_{ref}$))") produced by the third stage 905 of the reference signal generation circuitry of FIG. 9.

Figure 10C:
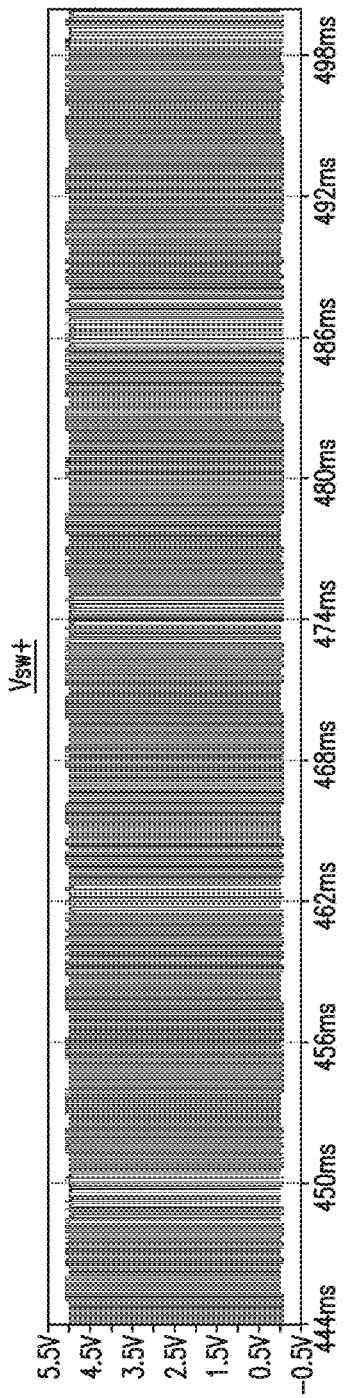

FIG. 10C shows the voltage waveform V$_{sw+}$ generated by the stage 733 of the hysteresis control circuitry 603 to control the ON/OFF states of the transistors 701 and 703 of the switching network.

Figure 10D:
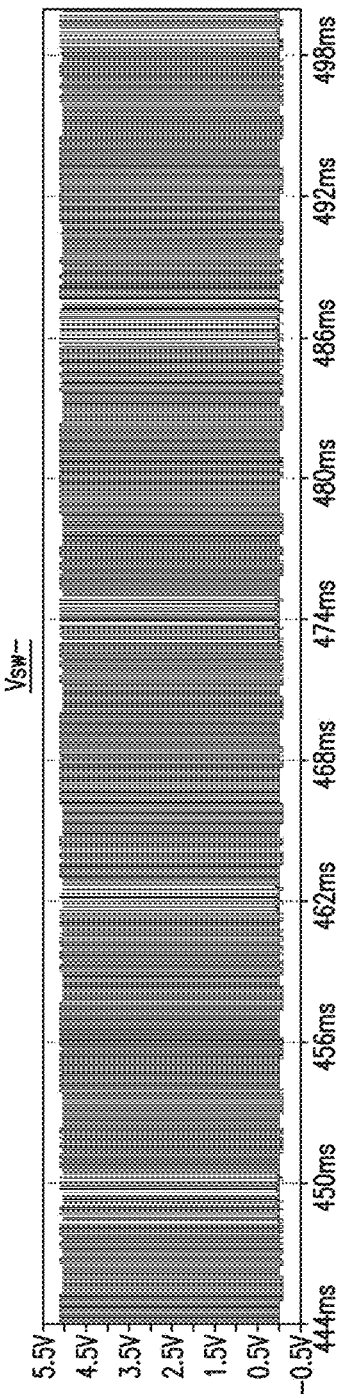

FIG. 10D shows the voltage waveform V$_{sw-}$ generated by the stage 733 of the hysteresis control circuitry 603 to control the ON/OFF states of the transistors 702 and 704 of the switching network.

Figure 11:
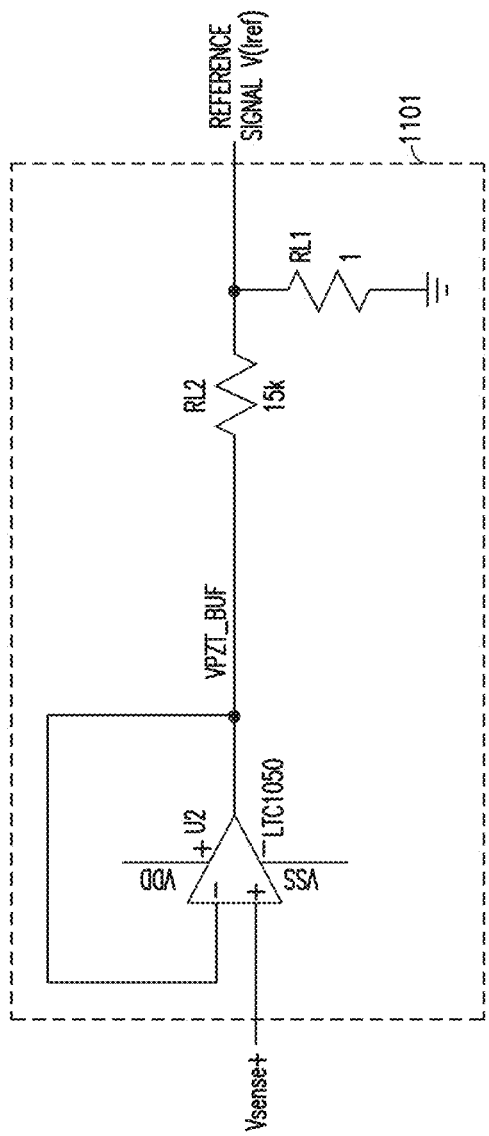
FIG. 11 illustrates another embodiment of the reference signal generation circuitry of FIG. 6 suitable for controlling the switching network and is configured to cause the effective loading of the electrical power storage device to synthesize a resistive load.

FIG. 11 illustrates a configuration of the reference signal generation circuitry 609 that is adapted to generate a reference signal (v($I_{ref}$)) which represents the magnitude and phase of a target current flow between the energy harvester 102 and the electrical power storage device(s) 108 for a desired resistive load. In this case, the reference signal generation circuitry 609 includes a stage 1101 that has an op-amp buffer amplifier and resistor network that output a single-ended voltage signal corresponding to the voltage signal (V$_{sense+}$) at the positive output of the energy harvester 102, and thus senses (measures) the voltage signal (V$_{sense+}$) at the positive output of the energy harvester. Other suitable circuits can also be used (possibly with negative or positive gain). The voltage waveform produced by the stage 1101 is the reference signal (v($I_{ref}$)), which represents the magnitude and phase of a target current flow between the energy harvester 102 and the electrical power storage device(s) 108 for a desired resistive loading. The effective gain of stage 1101 is proportional to the ratio of the peak magnitude of the average measured voltage signal (V$_{sense+}$) to the peak magnitude of the average measured signal (v($I_{sense}$)) and corresponds to the size of the resistance synthesized by the operation of the switching network. For example, the effective gain of stage 1101 can be configured such that the peak magnitude of the average measured voltage signal (V$_{sense+}$) is 1.6V, and the peak magnitude of the average measured signal (v($I_{sense}$)) is 120 µA, which provides a ratio that corresponds to a synthesized resistor of 13.3 k-ohms.

Figure 12A:
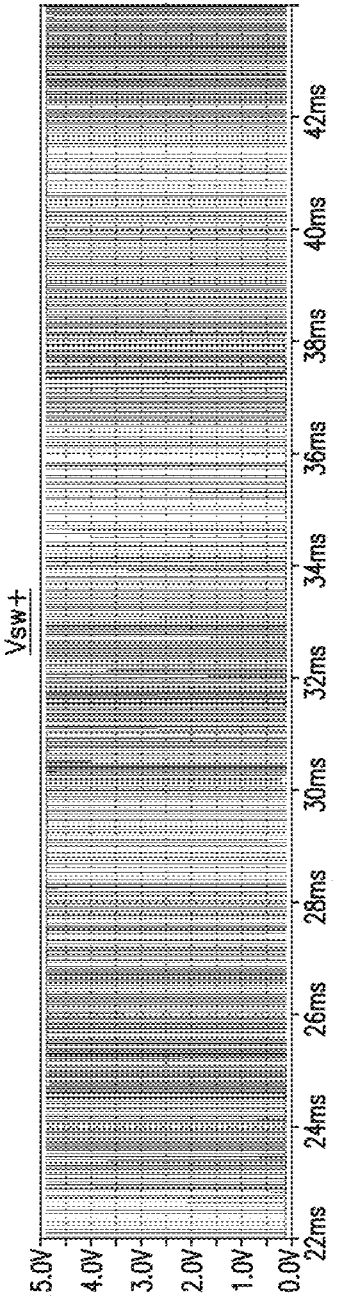

FIGS. 12A-12C are waveforms that illustrate operations of the power electronics 104 of FIGS. 6, 7A, 7C, 7D and 11 where the switching network 601 is configured to cause the effective loading of the electrical power storage device 108 to synthesize the impedance characteristics of a resistor.

FIG. 12A shows the voltage waveform V$_{sw+}$ generated by the stage 733 of the hysteresis control circuitry 603 to control the ON/OFF states of the transistors 701 and 703 of the switching network.

FIG. 12B shows the voltage waveform (labeled "measured signal (v($I_{sense}$))") produced by stage 721 of the measured signal generation circuitry of FIG. 7C.

FIG. 12C shows the voltage waveform (labeled "measured voltage signal") produced by the stage 1101 of the reference current signal generation circuitry of FIG. 11.

Note that the measured voltage signal and the measured signal (v($I_{sense}$)) are in phase with respect to one another, confirming that the synthesized load impedance is resistive. This implies that the output power from the harvester is effectively delivered to the switching network and stored in the electrical power storage.

The analog circuitry of FIGS. 7B, 7C, 7D, 9 and 11 depicts that the architecture of the control circuitry that controls the switching network 601 for synthesizing the various load impedances. It is contemplated that complex load impedances can be synthesized with control circuitry that combines multiple implementations of the reference current signal generation circuitry as described herein (for example, through superposition) or by suitable modification to the parameters of the reference signal generation circuitry. For example, the reference signal generation circuit of FIG. 7B can be configured to synthesize an inductive load or a parallel-RL load as described herein. It is also contemplated that the circuit architecture of the control circuitry can be derived by matching the current-voltage waveforms of a circuit realized from discrete real load elements (inductor(s), capacitor(s), and/or resistor(s)). It is also contemplated that the control circuitry (or parts thereof) as described herein can be realized by a digital signal processor or other suitable control platforms, which can provide more efficient and effective tunability of the load impedance synthesized by the controlled operation of the switching network, more diverse functionality and reduced power consumption.

Figure 13:
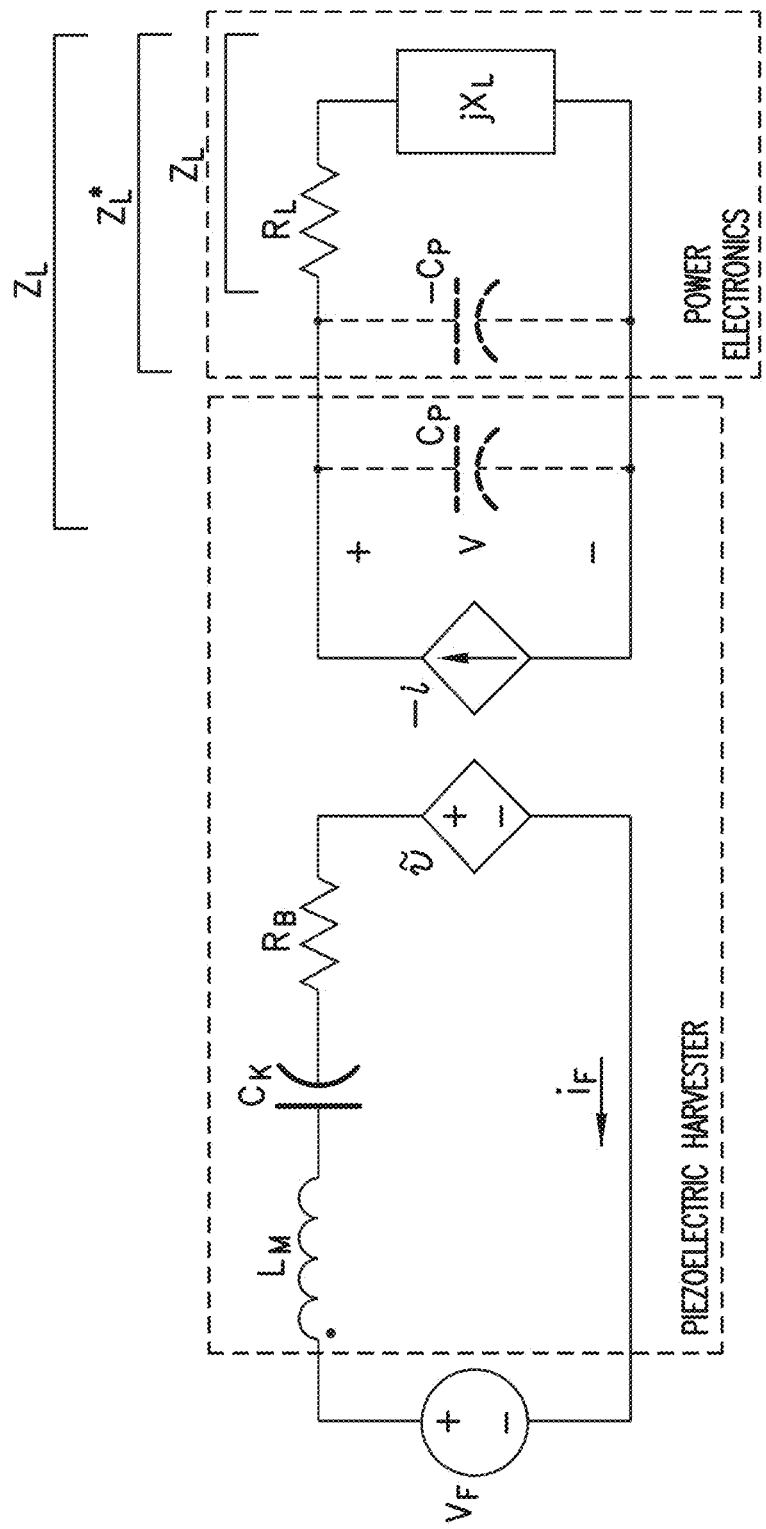
FIG. 13 is a schematic representation of an equivalent circuit model of a piezoelectric harvester in conjunction with the power electronics of FIG. 6.

In order to gain more intuition from a circuit point of view, the mechanical spring-mass-damper model of the energy harvester can be transformed into an equivalent circuit model shown in FIG. 13. Here, the model represents a piezoelectric harvester, which contains a parallel parasitic capacitance $C_p$ at the electrical output. Note that $C_p$ will greatly affect the output electrical characteristics of the harvester. In one embodiment, the switching network 601 is controlled to realize impedance that is matched to the parasitic capacitance $C_p$ and effectively cancels out the effect of the parasitic capacitance $C_p$ and thus fulfill the harvester's maximum energy transfer potential. In another embodiment, the switching network is controlled to create additional resonance modes to enable the energy harvester system to harvest energy from multiple vibration frequencies at the same time.

With respect to matching the parasitic capacitance $C_p$, there are essentially two approaches to finding the matched load for the piezoelectric harvester. The first approach is to implement a negative capacitance ($-C_r$) in parallel with the external load so as to cancel $C_p$. With $C_p$ cancelled, the load $Z_L(\omega)$ now represents the remaining matched load. The second approach is to fold $C_p$ into the implemented load $Z_L(\omega)$ such that $$Z_L^* = \frac{-1}{j\omega C_p} \| Z_L \qquad \text{Eqn. (1)}$$

where it is $Z_L^*$ that is synthesized by the switching network. In this case, $$Z_L^* = \frac{R_L + jX_L}{1 - j\omega C_p(R_L + jX_L)} = \frac{R_L + jX_L}{1 + \omega C_p X_L - j\omega C_p R_L} \qquad \text{Eqn. (2)}$$

Note that both approaches could have stability concerns but need not be implemented in broadband. Rather, each approach can be implemented at the specific resonant frequency of the harvester.

In order to develop an equivalent electrical model, the piezoelectric coupling can be modeled as an equivalent transformer, as shown in FIG. 13. The closed circuit on the left hand side of FIG. 13 represents the spring-mass-damper mechanical model where the mass is expressed as an equivalent inductance $L_M$, the spring is expressed as an equivalent capacitance $C_K$ and the damper is expressed as an equivalent resistance $R_B$. In this model, voltage represents force and current represents velocity. To get a sense of how the spring-mass-damper model translates to the equivalent circuit model, one can write out the differential equations for both models. For the spring-mass-damper model, the differential equation is given as $$M\frac{d^2 x}{dt^2} + B\frac{dx}{dt} + kx = -M\frac{d^2 y}{dt^2} + f \qquad \text{Eqn. (3)}$$

Now let us define the relationship between velocity and current, and the relationship between force and voltage, as $$i_F \equiv -J_i \cdot \frac{dx}{dt} \qquad \text{Eqn. (4)}$$

$$V_F \equiv J_v \cdot M \frac{d^2 y}{dt^2} \qquad \text{Eqn. (5)}$$

where $i_F$ and $V_F$ are the current and voltage scales from velocity and force. $J_i$ and $J_v$ have the units of [A·s/m] and [V/N]. Following substitutions of Eqns. (4) and (5), Eqn. (3) can be rewritten as $$-\left(\frac{M}{J_i}\right) \cdot \frac{di_F}{dt} - \left(\frac{B}{J_i}\right) \cdot i_F - \frac{k}{J_i}\int i_F dt = -\frac{V_F}{J_v} + f \qquad \text{Eqn. (6)}$$

Multiplying both sides of Eqn. (6) by $(-J_v)$ yields $$-\left(M\frac{J_v}{J_i}\right) \cdot \frac{di_F}{dt} - \left(B\frac{J_v}{J_i}\right) \cdot i_F - k\frac{J_v}{J_i}\int i_F dt = V_F - f \cdot J_v \qquad \text{Eqn. (7)}$$

Eqn. (7) can be reorganized as $$L_M \frac{di_F}{dt} + R_B \cdot i_F + \frac{1}{C_K}\int i_F dt = V_F - \tilde{v} \qquad \text{Eqn. (8a)}$$

$$\text{where } L_M \equiv M \cdot \frac{J_v}{J_i} \qquad \text{Eqn. (8b)}$$

$$R_B \equiv B \cdot \frac{J_v}{J_i} \qquad \text{Eqn. (8c)}$$

$$C_K \equiv \frac{1}{k} \cdot \frac{J_i}{J_v} \qquad \text{Eqn. (8d)}$$

$$\tilde{v} = J_v \cdot f = J_v \cdot G_p v \qquad \text{Eqn. (8e)}$$

The equivalent circuit model can be understood from FIG. 13. Analyzing the left-half closed circuit in FIG. 13 and assuming a sinusoidal steady state, it can be shown that $$i_F = \frac{V_F - G_p J_v V}{j\omega L_M + \frac{1}{j\omega C_K} + R_B} = \frac{j\omega C_K(V_F - G_p J_v V)}{1 - \omega^2 C_K L_M + j\omega C_K R_B} \qquad \text{Eqn. (9)}$$

The output voltage V can be expressed as $$V = Z_L \cdot (-i) = Z_L \cdot \frac{G_p}{J_i} i_F \qquad \text{Eqn. (10)}$$

By substituting Eqn. (10) into Eqn. (9) with some further reorganization, the equivalent proof mass velocity $i_F$ can be shown to be $$i_F = \frac{j\omega C_K V_F}{1 - \omega^2 C_K L_M + j\omega C_K\left(R_B + Z_L \tilde{G}_p^2\right)} \qquad \text{Eqn. (11a)}$$

$$\text{where } \tilde{G}_p^2 = G_p^2 \cdot \frac{J_v}{J_i} \qquad \text{Eqn. (11b)}$$

Expanding $Z_L$ into $(R_L+jX_L)$, $i_F$ can then be expressed as $$i_F = \frac{j\omega C_K V_F}{\left(1 - \omega^2 C_K L_M - \omega C_k \tilde{G}_p^2 X_l\right) + j\omega C_K\left(R_B + R_L \tilde{G}_p^2\right)} \qquad \text{Eqn. (12)}$$

The output power $P_L$ delivered to the resistive load $R_L$ can then be derived as follows:

$$P_L = \frac{1}{2}|i|^2 R_L = \frac{1}{2}\tilde{G}_p^2 |i_F|^2 R_L \qquad \text{Eqn. (13a)}$$

$$P_L = \frac{\frac{1}{2}\tilde{G}_p^2 R_L \omega^2 C_K^2 |V_F|^2}{\left(\frac{1}{\omega C_K} - \omega L_M - \tilde{G}_p^2 R X_L\right)^2 + \left(R_B + R_L \tilde{G}_p^2\right)^2} \qquad \text{Eqn. (13b)}$$

The output power $P_L$ is maximized at $$X_L = \frac{1}{\tilde{G}_p^2}\left(\frac{1}{\omega C_K} - \omega L_M\right), \text{ and} \quad \text{Eqn. (14)}$$

$$R_L = \frac{R_B}{\tilde{G}_p^2} \quad \text{Eqn. (15)}$$

At this matching condition, the maximum power can be expressed as $$P_L = \frac{|V_F|^2}{8R_B} = \frac{M^2\omega^4|Y|^2}{8R_B} \quad \text{Eqn. (16)}$$

From the result shown in Eqn. (16), one can derive the theoretical maximum output power that the harvester can deliver to the resistive load at a given frequency. In addition, the required resistance and reactance for this maximum output is given in Eqns. (14) and (15) at each frequency. By further analyzing the optimal load resistance $R_L$ given in Eq. (15), it is evident that it depends on the mechanical damping $R_B$ and the conversion ratio $\tilde{G}_p$. Both $R_B$ and $\tilde{G}_p$ are constant physical parameters of a given harvester. Therefore, the optimal load resistance is independent of frequency, meaning that regardless of the vibration frequency and number of harmonics, the optimal load resistance remains constant. This is an important result for harvester impedance matching. On the other hand, the optimal load reactance $X_L$, as expected, is frequency dependent and is determined by the equivalent spring-mass and the conversion ratio as evident from Eqn. (14). From another perspective, $X_L$ makes certain that the resonance condition is satisfied at all frequencies and provides the possibility of tuning the resonant frequency and creating additional resonances.

It is know that the resonant frequency of a vibration harvester can be electrically tuned by loading the harvester with reactive components such as inductors and capacitors. The additional inductor and capacitor changes the load reactance $X_L$ and effectively changes the roots of Eqn. (14), which determine the resonant frequency. For example, consider the example of using a load inductor to electrically tune the resonance frequency of a vibration harvester. With no reactive loading, the resonant frequency $\omega_{RES}$ of the mechanical system can be found from Eqn. (14) as $$\omega_{RES} = \sqrt{\frac{1}{L_M C_K}} \quad \text{Eqn. (17)}$$

With an inductive load, the load reactance $X_L = \omega L_L$ and the resonant frequency then becomes $$\omega_{RES} = \sqrt{\frac{1}{C_{K(L_M + \tilde{G}_p^2 L_L)}}} \quad \text{Eqn. (18)}$$

This indicates that an inductive load lowers the resonant frequency. As one would expect, a capacitive load would have an opposite effect and increase the resonant frequency. It is expected that large inductors with inductance values up to many tens of Henries will be desired for tuning the resonant frequency of the system. Inductors with inductance values in this range present a serious challenge to be built in a low-loss fashion.

The embodiments described herein address this issue by simulating such large inductors (and possibly more complex loads) with an intelligent power switching network. The motivation for such embodiments stems from the desire to efficiently harvest energy from multi-frequency or multi-harmonic vibration characteristics commonly found in vibrations created by machinery and consumer electronics. Most vibration energy harvesters, disregarding non-linear or bi-stable structured designs, resonate at a single frequency with a high quality factor and hence a small frequency band of operation. Therefore, in order for the harvester to load match at multiple frequencies without changing the physical structure of the harvester, additional resonances are created with some kind of electrical load.

Figure 14:
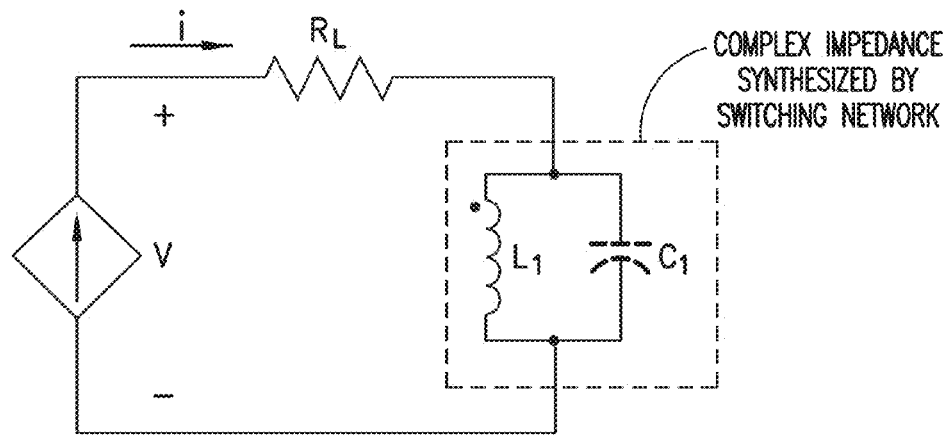
FIG. 14 is a schematic representation of a reactive load (particularly, a parallel-LC impedance) synthesized by control of the switching network of FIG. 6 that is suitable for realizing a dual-resonance energy harvesting system.

One approach is to configure the power switching network 601 as described herein to simulate an LC resonator as shown in FIG. 14. Qualitatively speaking, the LC resonator created by $L_1$ and $C_1$ will create an additional resonance such that the energy harvesting system becomes a dual-resonance system capable of extracting energy at two frequencies. However, the two resonant frequencies are not simply $$\sqrt{\frac{1}{L_M C_K}} \text{ and } \sqrt{\frac{1}{L_1 C_1}}.$$

This is due to the interaction between the mechanical and electrical systems, and can be better understood by referring to Eqn. (13b). The conditions for matched loading is determined in part by $$\frac{1}{\omega C_k} - \omega L_m - G_p^2 X_L = 0 \quad \text{Eqn. (19)}$$

This is the reactive component of load matching for maximum power transfer. In the configuration of FIG. 14, the load reactance $X_L$ is the equivalent impedance of $L_1$ and $C_1$ in parallel to give $$X_L = \frac{L_1}{1 - \omega^2 L_1 C_1} \quad \text{Eqn. (20)}$$

By substituting Eqn. (20) into Eqn. (19), and solving for $\omega$, one can find the two load-matched frequencies. Such analysis can also be performed to find the capacitance $C_1$ and inductance $L_1$ for the load-matched conditions at two desired resonance frequencies.

Figure 15:
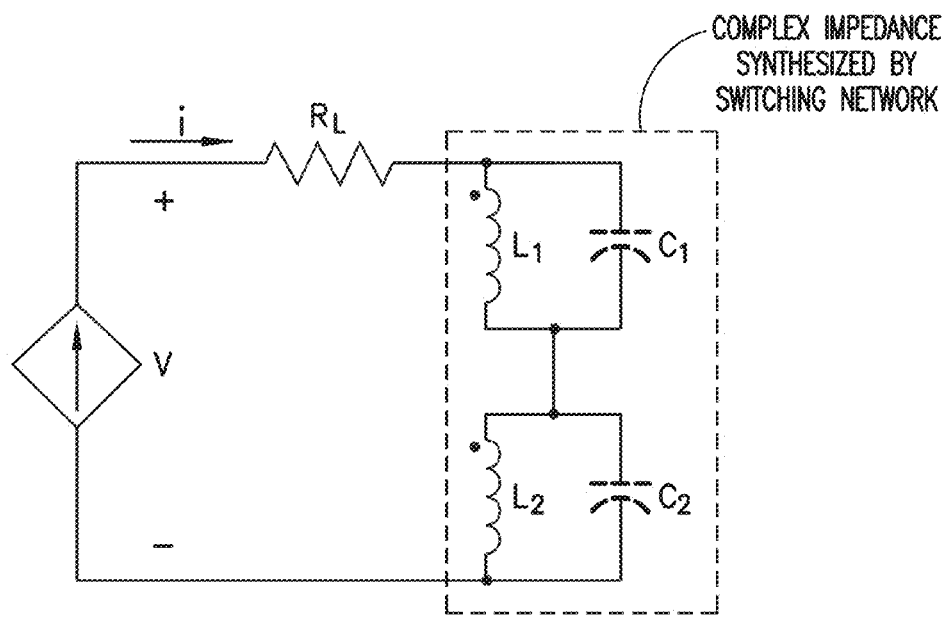
FIG. 15 is a schematic representation of another reactive load (particularly, a pair of series-coupled parallel-LC impedances) synthesized by control of the switching network of FIG. 6 that is suitable for realizing a triple-resonance energy harvesting system.

A triple-resonant energy harvesting system can be built upon the dual-resonant system developed in the previous section by adding an additional resonant frequency to the dual-resonant system. This can be achieved by building two LC resonators in series as shown in FIG. 15. The two resonators will create two poles located at $$\sqrt{\frac{1}{L_1 C_1}} \text{ and } \sqrt{\frac{1}{L_2 C_2}}.$$

These poles are simply the poles of the electronics and the actual resonance frequencies of the system will be different from these two poles. One can model the system to find the three load-matched frequencies. Such analysis can also be performed to find the capacitances $C_1$, $C_2$ and the inductances $L_1$, $L_2$ for the load-matched conditions at three desired resonance frequencies.

Figure 16:
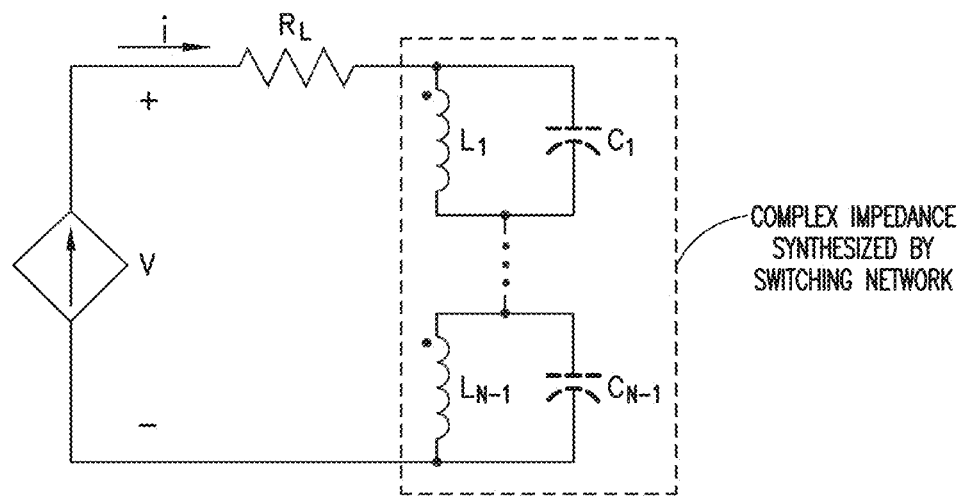
FIG. 16 is a schematic representation of yet another reactive load (particularly, a number (N−1) of series-coupled parallel-LC impedances) synthesized by control of the switching network of FIG. 6 that is suitable for realizing an N-resonance energy harvesting system.

The triple-resonant energy harvesting system can be extended to realize an N-resonant frequency harvester as shown in FIG. 16 with (N−1) LC tank circuits in series. This circuit is unrealistic to build with real reactive components, but can be synthesized with the switching network circuitry as described herein. One can model the system to find the N load-matched frequencies. Such analysis can also be performed to find the capacitances and the inductances for the load-matched conditions at N desired resonance frequencies.

Figure 17:
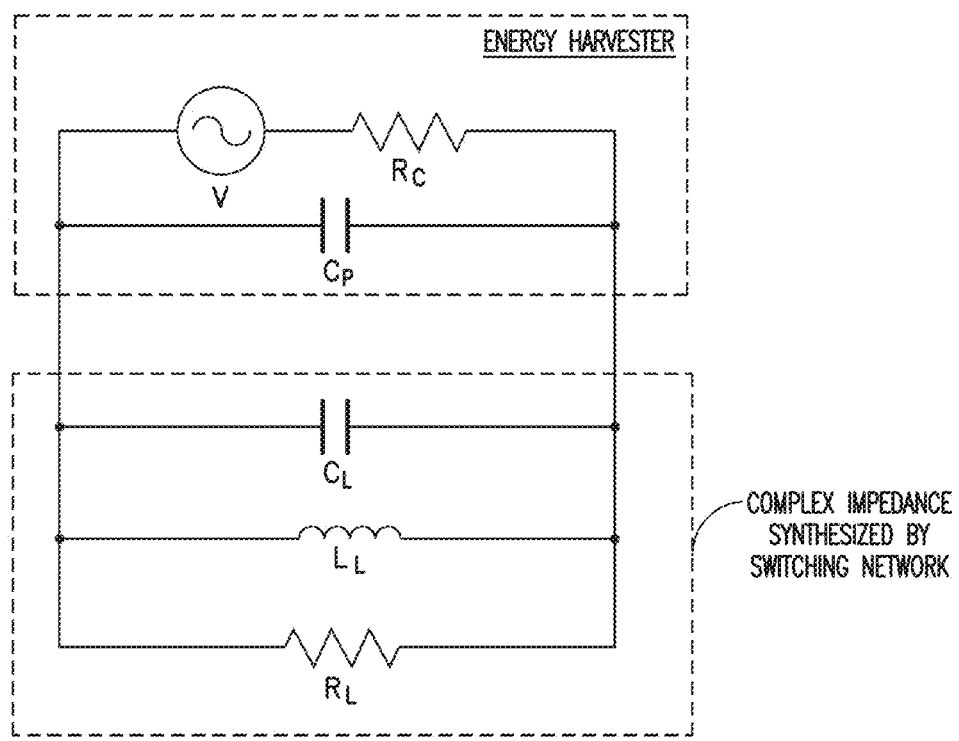
FIG. 17 is a schematic representation of another reactive load (particularly, a parallel-RLC) synthesized by control of the switching network of FIG. 6 that is suitable for realizing an energy harvesting system that compensates for the parasitic capacitance of the transducer of the system.
Figure 18:
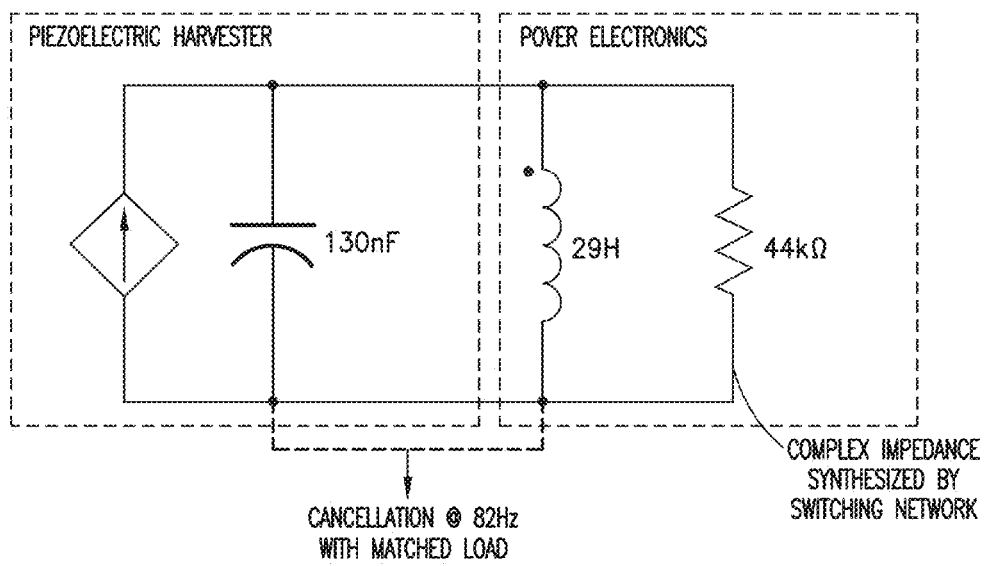
FIG. 18 is a schematic representation of a particular reactive load (a parallel-RL load where R is 44 k-Ohms and L is 29 H) synthesized by control of the switching network of FIG. 6 that is suitable for realizing an energy harvesting system that compensates for the parasitic capacitance of the transducer of the system at a resonance frequency of the system.

The switching network 601 can be configured to synthesize any arbitrary complex impedance, such as the RLC load shown in FIG. 17. In one example, the switching network 601 can be configured to synthesize a parallel-RL load as shown in FIG. 18. An energy harvester with the switching network circuitry configured to synthesize a parallel-RL load has two possible benefits. First, the inductance of the parallel-RL load can be sized to cancel out the parasitic capacitance at the resonant frequency of the system and fulfill the harvester's maximum energy transfer potential. For example, a piezoelectric harvester which has a 130 nF parasitic capacitance and 82 Hz resonant frequency requires an inductance of 29 H to cancel the parasitic capacitance. A resistance of 44 k-ohms for the resistance of the parallel-RL load matches this inductance at the resonant frequency. This configuration is illustrated in FIG. 18. The second potential benefit is the capability of creating a second resonance by controlling the size of the inductance of the parallel-RL load to enable the energy harvester system to harvest energy from two vibration frequencies at the same time. The harvester and the parallel-RL load will create two poles, the pole of the mechanical system of harvester itself (for example, at $$\sqrt{\frac{1}{L_M C_K}}$$

for the piezoelectric of FIG. 13) and the pole of the parallel-RL load at $$\sqrt{\frac{1}{L_L C_P}}.$$

These poles are simply the poles of the electronics and the two resonance frequencies of the system will be different from these two poles. One can model the system to find the two load-matched resonance frequencies. Such analysis can also be performed to find the inductance $L_L$ and resistance $R_L$ of the parallel-RL load for the load-matched conditions at a desired additional resonance frequency. The operational characteristics and power harvesting effect of a dual resonance system are shown in FIGS. 3 and 4.

It is also contemplated that the impedance loading synthesized by the switching network can be dynamically tuned according to operational characteristics of the harvester system. For example, an additional control block (labeled 615 in FIG. 6) can be implemented to sense the mode (frequency) of the excitation vibration and control the impedance loading synthesized by the switch network (for example, by controlling the configuration of the reference current generation circuitry) to provide a resonance harvesting mode at the mode of the excitation vibration. In another example, the control block can carry out a perturbate and observe scheme that updates the impedance loading synthesized by the switch network to maximize the harvested energy. The initial value of the impedance loading can be matched to the resonance characteristics of the harvester system and/or the mode of the excitation vibration input to the system over time.

The technological advances of the embodiments described above can be utilized in subsurface tools for oil & gas exploration and production as these embodiments can aid the designers of such subsurface tools to implement simple methods of collocating devices and power sources that derive electrical energy from harvesting of environmental vibrational energy.

Figure 19:
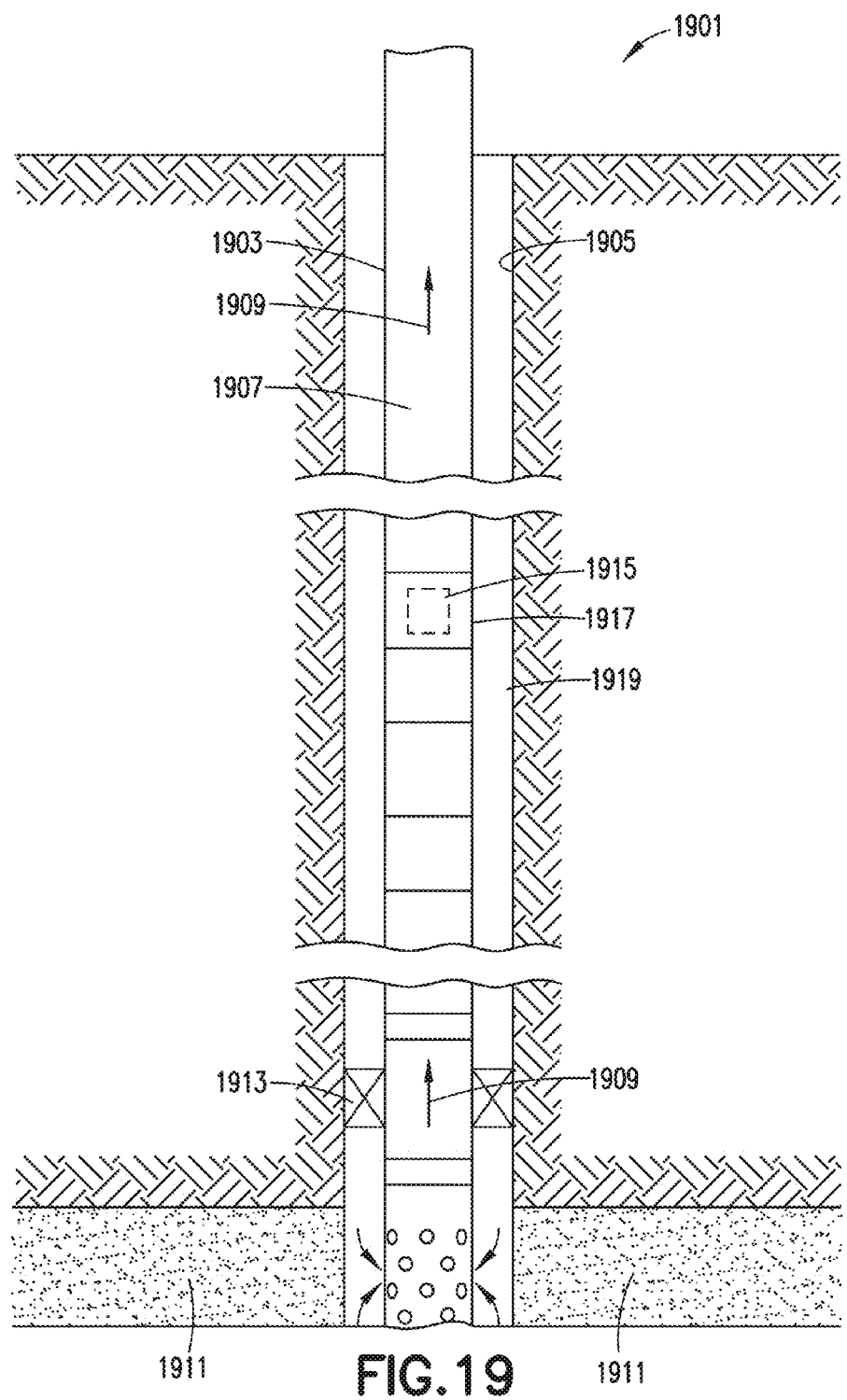
FIG. 19 is a schematic diagram of a hydrocarbon producing well according to an embodiment of the present application.

FIG. 19 shows an embodiment of a subsurface tool 1901 that includes a tubular string 1903 (a production string, for example) that extends into a wellbore 1905. The tubular string 1903 may include a central passageway 1907 that communicates a flow 1909 from a subterranean formation zone 1911 (or to a formation zone in the case of an injection well). The zone 1911 represents one out of many possible zones traversed by the wellbore 1905. The zone 1911 may be defined (i.e., isolated from other zones) by one or more packers 1913 (one being depicted in FIG. 19).

The flow 1909 is a primary source of vibrational energy downhole, and this vibrational energy can be captured by a vibrational energy harvesting system 1915 housed in a power generation tool body 1917 for purposes of converting the vibrational energy into downhole electrical power. This electrical power, in turn, may be used to power one or more downhole power-consuming components, such as sleeve valves, ball valves, motors, actuators, sensors, sound sources, electromagnetic signaling sources, or equipment to fire "smart bullets" into a well casing, perforating gun firing heads, controllers, microprocessors, Micro Electrical Mechanical Sensors (MEMS), telemetry systems (transmitters or receivers), etc., depending on the particular application. The vibrational harvesting system 1915 of the power generation tool body 1917 can be based on the embodiments described above.

The tubular string 1903 can include one or more vibration enhancement mechanisms (one shown as 1919) that enhance the generation of vibrational energy for capture by the vibrational energy harvesting system 1915. For example, the flow 1909 can enter the vibration enhancement mechanism 1919, which operates to produce a locally more turbulent flow that flows uphole. The creation of this more turbulent flow, in turn, amplifies the vibrational energy, thereby leading to the increased production of downhole power. The vibrational harvesting system 1915 can be located in proximity to (within ten feet, for example) to the vibration enhancing mechanism 1919.

The vibration enhancing mechanism 1919 can include a structural member (such as a flow path obstructer or diverter or Venturi-type orifice or flexible moving member) that is configured to create turbulence in the flow 1909 in order to generate environmental vibrations downhole in response to the flow 1909. The vibration enhancing mechanism 1919 can also be realized by varying the wall thickness of a portion of the tubular string 1903 in order to enhance the fundamental vibration mode of the tubular string portion. Other suitable vibration enhancing mechanisms can also be used.

In other embodiments, vibrational energy harvesting systems as described herein can be integrated as part of the subsurface production tool to harvest vibrational energy generated by artificial lift devices (such as gas lift valves and electrical submersible pumps). In yet other embodiments, the vibrational energy harvesting systems as described herein can be integrated as part of the surface-located production tools as well as subsea-located tree structures that monitor and control the operation of subsea wells in order to harvest vibration from the flow of produced fluid.

Figure 20:
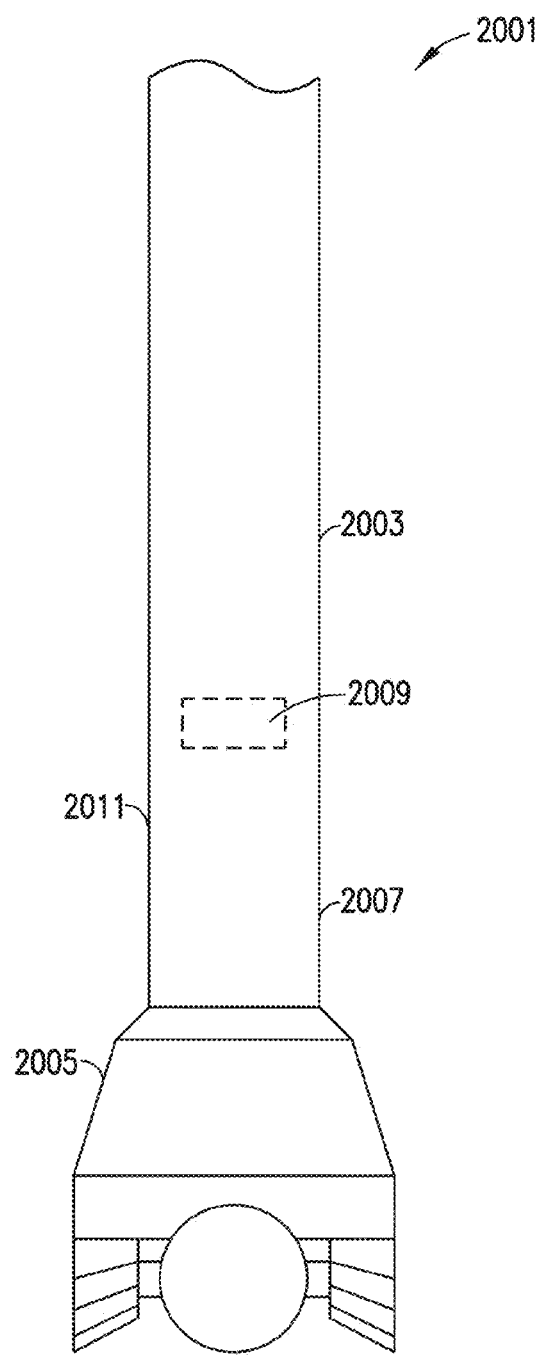
FIG. 20 is a schematic diagram of a subsurface drilling string according to an embodiment of the present application.

FIG. 20 depicts a drill string 2001 that includes a mud motor 2003 and a drill bit 2005. The drill string 2001 may include a tool body 2007 with sensors that are used for purposes of monitoring operation of the drill string 2001 and monitoring general operation of the drilling. The sensors typically are located close to the drill bit 2005. A particular challenge with this arrangement is that the sensor tool body 2007 may be located away from a power source and thus, electrical cables may have to span across the mud motor 2003 for purposes of delivering power to the sensors of the tool body 2007. However, in accordance with an embodiment of the present application, the sensor tool body 2007 may be in close proximity to a vibrational energy harvesting system 2009 housed in a power generation tool body 2011 for purposes of converting downhole vibrational energy of the drill string 2001 (which occurs during operation of the mud motor 2003 and interaction between the drill bit 2005 and the formation rock). This electrical power, in turn, may be used to power one or more downhole power-consuming components, such as the sensors, telemetry system (transmitter and receiver) and/or other electrical components of the sensor tool body 1007. The vibrational harvesting system 2009 of the power generation tool body 2011 can be based on the embodiments described above. Due to this arrangement, cabling does not have to be extended across the mud motor 2003 for purposes of delivering power to the electrical components of the sensor tool body 2007. Furthermore, due to the generation of electrical power downhole, various control lines and electrical cables do not need to be extended from the surface of the well.

It is also contemplated that there may be a need to configure the energy harvester system such that it works as an actuator that introduces vibrational signals to the tool or back into the drilling environment. In this case, the switching network of the power electronics can be controlled such that it acts to drive the desired vibrations of the mass of the energy harvester for supply to the tool and/or into the drilling environment.

Although only a few example embodiments have been described in detail above, those skilled in the art will readily appreciate that many modifications are possible in the example embodiments without materially departing from this invention. Accordingly, all such modifications are intended to be included within the scope of this disclosure as defined in the following claims. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. §112, paragraph 6 for any limitations of any of the claims herein, except for those in which the claim expressly uses the words 'means for' together with an associated function.

What is claimed is:

1. An apparatus for converting vibrational energy to electrical energy comprising:
   a vibrational energy harvester having a transducer for generating time-varying electrical signals in response to environmental vibration;
   at least one power storage device;
   a switching network operably coupled between the transducer of the vibrational energy harvester and the at least one power storage device, wherein the switching network includes a plurality of switching elements each defining a switchable current path that is controlled by a control signal supplied to the respective switching element; and
   electronics configured to generate the control signals for supply to the switching elements of the switching network, the electronics including first circuitry, second circuitry, third circuitry, and fourth circuitry;
   wherein the first circuitry is configured to generate a measured signal representing magnitude and phase of current flowing through the switching elements of the switching network between the transducer of the energy harvester and the at least one power storage device;
   wherein the second circuitry is configured to generate a reference signal representing magnitude and phase of a current characteristic of a desired effective impedance of the switching network;
   wherein the third circuitry is configured to generate an error signal based on a difference between the reference signal and the measured signal;
   wherein the fourth circuitry is configured to generate the control signals supplied to the switching elements of the switching network, wherein the control signals are based on the error signal and control operation of the switching elements of the switching network such that the switching network provides the desired effective impedance; and
   wherein the second circuitry comprises a voltage sensing stage with an input operably coupled to an output of the transducer of the energy harvester to generate an output signal that represents measured voltage output by the transducer, and the second circuitry further comprises an integrator stage that integrates an output signal of the voltage sensing stage to generate a signal whose phase lags by 90 degree the phase of the signal output from the voltage sensing stage.

2. An apparatus according to claim 1, wherein:
   the first circuitry comprises a differential amplifier stage whose inputs are operably coupled across a sense resistor disposed in a current path between the transducer of the energy harvester and the switching network to generate a signal that represents the current output by the transducer.

3. An apparatus according to claim 1, wherein:
   the second circuitry further comprises an amplifier stage that adjusts the magnitude of the signal output from the integrator stage, whereby the output of the amplifier stage is the reference signal which represents magnitude and phase of current characteristic of a desired effective impedance of the switching network.

4. An apparatus according to claim 1, wherein:
   the third circuitry comprises a differential amplifier stage that produces an output representing difference between voltage levels of the reference signal and the measured signal, and the fourth circuitry applies hysteresis control in processing the error signal generated by the third circuitry in order to avoid system instability.

5. An apparatus according to claim 1, wherein:
the plurality of switching elements comprises four transistors arranged in an H-bridge configuration.

6. An apparatus according to claim 1, wherein:
the transducer of the vibrational energy harvester comprises at least one coil and magnet that move relative to one another, or at least one piezoelectric element.

7. An apparatus according to claim 1, wherein:
the reference signal generated by the second circuitry represents magnitude and phase of the current characteristic of a reactive load which includes an inductive load component.

8. An apparatus according to claim 7, wherein:
the reactive load further includes a capacitive load component, and the second circuitry further comprises a differentiator stage that differentiates the output signal of a voltage sensing stage to generate a signal whose phase leads by 90 degree the phase of the signal output from the voltage sensing stage for synthesizing the capacitive load component of the reactive load.

9. An apparatus according to claim 7, wherein:
the reactive load is matched to the energy harvester in order to compensate for parasitic capacitance of the energy harvester, or the reactive load is adapted to add at least one additional resonance frequency to the system.

10. An apparatus according to claim 7, wherein:
the reactive load comprises a parallel-LC impedance or a parallel-RL impedance.

11. An apparatus according to claim 1, wherein:
the second circuitry is configured by operation of a control block wherein the effective impedance characterized by the reference signal is dynamically updated over time in order to tune the effective impedance based upon operational characteristics of the energy harvester.

12. An apparatus according to claim 1, wherein:
the transducer, the switching network and the control electronics are configured to convert environmental vibrational energy into electrical energy, wherein the environmental vibrational energy is caused by fluid flow through a subterranean well or by drilling operations in a subterranean well.

13. A method for converting vibrational energy to electrical energy employing a vibrational energy harvester having a transducer for generating time-varying electrical signals in response to environmental vibration, at least one power storage device, and a switching network operably coupled between the transducer of the vibrational energy harvester and the at least one power storage device, wherein the switching network includes a plurality of switching elements each defining a switchable current path that is controlled by a control signal supplied to the respective switching element, the method comprising:
generating a measured signal representing magnitude and phase of current flowing through the switching elements of the switching network between the transducer of the energy harvester and the at least one power storage device;
generating a reference signal representing magnitude and phase of a current characteristic of a desired effective impedance of the switching network;
generating an error signal based on a difference between the reference signal and the measured signal; and
generating control signals supplied to the switching elements of the switching network, wherein the control signals are based on the error signal and control operation of the switching elements of the switching network such that the switching network provides the desired effective impedance;
wherein the reference signal is generated by deriving an output signal that represents measured voltage output by the transducer and integrating the output signal to generate a signal whose phase lags by 90 degree the phase of the output signal.

14. A method according to claim 13, further comprising:
applying hysteresis control in processing the error signal in order to avoid system instability.

15. A method according to claim 13, wherein:
the plurality of switching elements comprises four transistors arranged in an H-bridge configuration.

16. A method according to claim 13, wherein:
the reference signal represents magnitude and phase of the current characteristic of a reactive load which includes an inductive load component.

17. A method according to claim 16, wherein:
the reactive load further includes a capacitive load component; and
the generation of the reference signal involves differentiating an output signal representing measured voltage output by the transducer to generate a signal whose phase leads by 90 degree the phase of the output signal for synthesizing the capacitive load component of the reactive load.

18. A method according to claim 16, wherein:
the reactive load is matched to the energy harvester in order to compensate for parasitic capacitance of the energy harvester, or the reactive load is adapted to add at least one additional resonance frequency to the system.

19. A method according to claim 16, wherein:
the reactive load comprises a parallel-LC impedance or a parallel-RL impedance.

20. A method according to claim 13, wherein:
dynamically updating the impedance characterized by the reference signal over time in order to tune such impedance based upon operational characteristics of the energy harvester.

21. A method according to claim 13, wherein:
the transducer, the switching network and the control electronics are configured to convert environmental vibrational energy into electrical energy, wherein the environmental vibrational energy is caused by fluid flow through a subterranean well or by drilling operations in a subterranean well.

* * * * *